US012759224B2

(12) United States Patent
Kwisnek et al.

(10) Patent No.: US 12,759,224 B2
(45) Date of Patent: Oct. 13, 2026

(54) RADIATION CURABLE COMPOSITIONS FOR ADDITIVE FABRICATION WITH IMPROVED TOUGHNESS AND HIGH TEMPERATURE RESISTANCE

(71) Applicant: Stratasys, Inc., Eden Prairie, MN (US)

(72) Inventors: Luke Kwisnek, Elgin, IL (US); Brad Seurer, Elgin, IL (US)

(73) Assignee: Stratasys, Inc., Minnetonka, MN (US)

( * ) Notice: Subject to any disclaimer, the term of this patent is extended or adjusted under 35 U.S.C. 154(b) by 0 days.

(21) Appl. No.: 17/580,747

(22) Filed: Jan. 21, 2022

(65) Prior Publication Data

US 2022/0134641 A1 May 5, 2022

Related U.S. Application Data

(63) Continuation of application No. 16/084,645, filed as application No. PCT/US2017/022311 on Mar. 14, 2017, now abandoned.

(60) Provisional application No. 62/308,023, filed on Mar. 14, 2016.

(51) Int. Cl.

| | |
|---|---|
| ***B29C 64/129*** | (2017.01) |
| ***B29C 64/268*** | (2017.01) |
| ***B29C 64/277*** | (2017.01) |
| ***B29C 64/393*** | (2017.01) |
| ***B33Y 70/00*** | (2020.01) |
| ***C08K 5/55*** | (2006.01) |
| ***C08L 63/00*** | (2006.01) |
| ***C08L 67/06*** | (2006.01) |
| ***C08L 91/00*** | (2006.01) |
| ***G03F 7/00*** | (2006.01) |
| ***G03F 7/027*** | (2006.01) |
| ***G03F 7/038*** | (2006.01) |
| ***G03F 7/105*** | (2006.01) |

(52) U.S. Cl.

CPC .......... *B29C 64/129* (2017.08); *B29C 64/268* (2017.08); *B29C 64/277* (2017.08); *B29C 64/393* (2017.08); *B33Y 70/00* (2014.12); *C08L 63/00* (2013.01); *C08L 67/06* (2013.01); *C08L 91/00* (2013.01); *G03F 7/0037* (2013.01); *G03F 7/027* (2013.01); *G03F 7/038* (2013.01); *G03F 7/105* (2013.01); *C08K 5/55* (2013.01)

(58) Field of Classification Search

CPC ...................................................... B33Y 10/00

See application file for complete search history.

(56) References Cited

U.S. PATENT DOCUMENTS

| | | | |
|---|---|---|---|
| 3,679,534 | A | 7/1972 | Weinberg |
| 5,002,976 | A | 3/1991 | McConnell et al. |
| 5,783,615 | A | 7/1998 | Steinmann et al. |
| 5,783,712 | A | 7/1998 | Steinmann et al. |
| 5,981,616 | A | 11/1999 | Yamamura et al. |
| 6,127,085 | A | 10/2000 | Yamamura et al. |
| 6,136,497 | A | 10/2000 | Melisaris et al. |
| 6,287,745 | B1 | 9/2001 | Yamamura et al. |
| 6,399,277 | B1 | 6/2002 | Jojima et al. |
| 6,413,697 | B1 | 7/2002 | Melisaris et al. |
| 6,469,071 | B1 | 10/2002 | Fan et al. |
| 6,565,969 | B1 | 5/2003 | Lamon et al. |
| 6,727,035 | B2 | 4/2004 | Yamamura et al. |
| 6,730,734 | B1 | 5/2004 | Hamilton et al. |
| 6,894,113 | B2 | 5/2005 | Court et al. |
| 7,183,040 | B2 | 2/2007 | Thies et al. |
| 7,232,850 | B2 | 6/2007 | Johnson et al. |
| 7,307,123 | B2 | 12/2007 | Johnson et al. |
| 8,362,148 | B2 | 1/2013 | Messe et al. |
| 2002/0018959 | A1 | 2/2002 | Lawton et al. |
| 2002/0048717 | A1 | 4/2002 | Yamamura et al. |
| 2002/0132872 | A1 | 9/2002 | Yamamura et al. |
| 2002/0177073 | A1 | 11/2002 | Melisaris et al. |
| 2003/0059708 | A1 | 3/2003 | Yamamura et al. |
| 2003/0149189 | A1 | 8/2003 | Cheung et al. |
| 2003/0207959 | A1 | 11/2003 | Napadensky et al. |
| 2004/0034124 | A1 | 2/2004 | Court et al. |
| 2004/0106692 | A1 | 6/2004 | Yamamura et al. |
| 2004/0137368 | A1 | 7/2004 | Steinmann |

(Continued)

FOREIGN PATENT DOCUMENTS

| | | | |
|---|---|---|---|
| CN | 1296577 | A | 5/2001 |
| CN | 101300527 | B | 11/2008 |

(Continued)

OTHER PUBLICATIONS

International Search Report, PCT/US2017/022311, date of mailing: Jun. 28, 2017, Authorized officer: Laure Mensah.

(Continued)

*Primary Examiner* — Liam J Heincer

(74) *Attorney, Agent, or Firm* — Faegre Drinker Biddle & Reath LLP

(57) ABSTRACT

Radiation curable compositions for additive fabrication with improved toughness are described and claimed. Such resins include a rubber toughenable base resin package and a liquid, phase-separating toughening agent. The rubber toughenable base resin, which may possess a suitably high average molecular weight between crosslinks and may be a pre-reacted hydrophobic macromolecule, may further include a cationically polymerizable component, a radically polymerizable component, a cationic photoinitiator, a free radical photoinitiator, and customary additives. Also described and claimed are methods for forming a three-dimensional objects using such radiation curable compositions for additive fabrication with improved toughness, along with the three-dimensional parts created therefrom.

21 Claims, No Drawings

(56) References Cited

U.S. PATENT DOCUMENTS

| | | | |
|---|---|---|---|
| 2005/0171255 | A1 | 8/2005 | Yamamura et al. |
| 2007/0051470 | A1 | 3/2007 | Iwakoshi et al. |
| 2007/0232713 | A1 | 10/2007 | Takase et al. |
| 2008/0051511 | A1 | 2/2008 | Guerret et al. |
| 2008/0200589 | A1 | 8/2008 | Hubschmid |
| 2009/0008826 | A1 | 1/2009 | Court et al. |
| 2009/0239175 | A1 | 9/2009 | Steinmann |
| 2010/0015408 | A1 | 1/2010 | Fong et al. |
| 2010/0104832 | A1 | 4/2010 | Messe et al. |
| 2010/0152314 | A1 | 6/2010 | Ito et al. |
| 2010/0227941 | A1 | 9/2010 | Ueda et al. |
| 2010/0304088 | A1 | 12/2010 | Steeman et al. |
| 2011/0213058 | A1 | 9/2011 | Yano |
| 2011/0293891 | A1 | 12/2011 | Leyden et al. |
| 2011/0319523 | A1 | 12/2011 | Ji et al. |
| 2013/0037993 | A1 | 2/2013 | Chen et al. |
| 2015/0125702 | A1 | 5/2015 | He et al. |
| 2015/0218299 | A1 | 8/2015 | Xie et al. |
| 2016/0200895 | A1 | 7/2016 | Lipscomb et al. |
| 2016/0326344 | A1 | 11/2016 | Yano |
| 2017/0059751 | A1 | 3/2017 | Chakraborty et al. |
| 2017/0145184 | A1 | 5/2017 | He et al. |
| 2018/0265669 | A1 | 9/2018 | He et al. |
| 2019/0077073 | A1 | 3/2019 | Kwisnek et al. |

FOREIGN PATENT DOCUMENTS

| | | | |
|---|---|---|---|
| CN | 104610511 | A | 5/2015 |
| EP | 0646580 | A2 | 4/1995 |
| EP | 0938026 | A1 | 8/1999 |
| EP | 1437624 | A1 | 7/2004 |
| EP | 1290088 | B1 | 1/2005 |
| EP | 1939234 | A1 | 7/2008 |
| EP | 2118169 | B1 | 7/2012 |
| JP | H05289337 | A | 11/1993 |
| JP | 2002-509982 | A | 4/2002 |
| JP | 2003192887 | A | 7/2003 |
| JP | 2003238691 | A | 8/2003 |
| JP | 2004300954 | A | 10/2004 |
| JP | 2007-073751 | A | 3/2007 |
| JP | 2008266551 | A | 11/2008 |
| JP | 2011240939 | A | 12/2011 |
| KR | 20000022549 | A | 4/2000 |
| KR | 10-2007-0052705 | A | 5/2007 |
| KR | 10-2008-0061383 | A | 7/2008 |
| WO | 98/00759 | A1 | 1/1998 |
| WO | 99/50711 | A1 | 10/1999 |
| WO | 00/63272 | A1 | 10/2000 |
| WO | 01/75524 | A2 | 10/2001 |
| WO | 01/95030 | A2 | 12/2001 |
| WO | 3063572 | A2 | 8/2003 |
| WO | 2005/014699 | A1 | 2/2005 |
| WO | 2005/116103 | A1 | 12/2005 |
| WO | 2006/077153 | A2 | 7/2006 |
| WO | 2007/009957 | A1 | 1/2007 |
| WO | 2007/037434 | A1 | 4/2007 |
| WO | 2007/048819 | A1 | 5/2007 |
| WO | 2007/124911 | A1 | 11/2007 |
| WO | 2008/115057 | A1 | 9/2008 |

OTHER PUBLICATIONS

Dodiuk et al., “Introduction,” in: Handbook of Thermoset Plastics (Third Edition), William Andrew Publishing, 2014, pp. 1-12.

Fine et al., “Structures and rheological properties of reactive solutions of block copolymers. Part 1. Diblock copolymers in a liquid epoxy monomer,” Polymer, May 23, 2005, vol. 46, pp. 6605-6613.

Valette et al., “Toughness Improvement in Epoxy/Anhydride Formulations for Electrical Insulation,” 2009 IEEE Electrical Insulation Conference, Montreal Canada, May 31-Jun. 3, 2009, pp. 301-305.

Verschueren et al., Cycloaliphatic Epoxide Resins for Cationic UV-Cure, UCB Chemicals s.a. Chemical Sector, Belgium, UCB Chemicals (Malaysia) Sdn Bhd., RadTech Asia, 1999, pp. 269-288.

Dodiuk et al. (Handbook of Thermoset Plastics, 2014, Chapter 1, p. 1-12) (Year: 2014).

Fine, et al., Structures and rheological properties of reactive solutions of block copolymers Part 1, Diblock copolymers in a liquid epoxy monomer, Polymer, May 23, 2005, pp. 6605-6613, vol. 46.

Kris Verschueren and Balwant Kaur, Cycloaliphatic Epoxide Resins for Cationic UV-Cure, UCB Chemicals s.a. Chemical Sector, Belgium, UCB Chemicals (Malaysia) Sdn Bhd., RadTech Asia pp. 269-274 (1999).

Valette et al. (Toughness Improvement in Epoxy/Anhydride Formulations for Electrical Insulation, 2009 IEEE Electrical Insulation Conference, Montreal Canada, May 31-Jun. 3, 2009). (Year: 2009).

RADIATION CURABLE COMPOSITIONS FOR ADDITIVE FABRICATION WITH IMPROVED TOUGHNESS AND HIGH TEMPERATURE RESISTANCE

CROSS-REFERENCE TO RELATED APPLICATIONS

This application is a continuation application of U.S. patent application Ser. No. 16/084,645, filed 13 Sep. 2018, which itself is the U.S. national phase of International Application No. PCT/US2017/022311, filed 14 Mar. 2017, which designated the United States and claims priority to U.S. Provisional Application No. 62/308,023, filed 14 Mar. 2016. The entire contents of each of these applications are hereby incorporated by reference as if set forth fully herein.

TECHNICAL FIELD

The present invention relates to radiation curable compositions for additive fabrication with improved toughness, and their application in additive fabrication processes.

BACKGROUND

Additive fabrication processes for producing three dimensional objects are well known. Additive fabrication processes utilize computer-aided design (CAD) data of an object to build three-dimensional parts. These three-dimensional parts may be formed from liquid resins, powders, or other materials.

A non-limiting example of an additive fabrication process is stereolithography (SL). Stereolithography is a well-known process for rapidly producing models, prototypes, patterns, and production parts in certain applications. SL uses CAD data of an object wherein the data is transformed into thin cross-sections of a three-dimensional object. The data is loaded into a computer which controls a laser that traces a pattern of a cross section through a liquid radiation curable resin composition contained in a vat, solidifying a thin layer of the resin corresponding to the cross section. The solidified layer is recoated with resin and the laser traces another cross section to harden another layer of resin on top of the previous layer. The process is repeated layer by layer until the three-dimensional object is completed. When initially formed, the three-dimensional object is, in general, not fully cured, and is called a "green model." Although not required, the green model may be subjected to post-curing to enhance the mechanical properties of the finished part. An example of an SL process is described in U.S. Pat. No. 4,575,330.

There are several types of lasers used in stereolithography, traditionally ranging from 193 nm to 355 nm in wavelength, although other wavelength variants exist. The use of gas lasers to cure liquid radiation curable resin compositions is well known. The delivery of laser energy in a stereolithography system can be Continuous Wave (CW) or Q-switched pulses. CW lasers provide continuous laser energy and can be used in a high speed scanning process. However, their output power is limited which reduces the amount of curing that occurs during object creation. As a result the finished object will need additional post process curing. In addition, excess heat could be generated at the point of irradiation which may be detrimental to the resin. Further, the use of a laser requires scanning point by point on the resin which can be time-consuming.

Other methods of additive fabrication utilize lamps or light emitting diodes (LEDs). LEDs are semiconductor devices which utilize the phenomenon of electroluminescence to generate light. At present, LED UV light sources currently emit light at wavelengths between 300 and 475 nm, with 365 nm, 390 nm, 395 nm, 405 nm, and 415 nm being common peak spectral outputs. See textbook, "Light-Emitting Diodes" by E. Fred Schubert, $2^{nd}$ Edition, © E. Fred Schubert 2006, published by Cambridge University Press, for a more in-depth discussion of LED UV light sources.

Many additive fabrication applications require a freshly-cured part, aka the "green model" to possess high mechanical strength (modulus of elasticity, fracture strength). This property, often referred to as "green strength," constitutes an important property of the green model and is determined essentially by the nature of the radiation curable composition employed in combination with the type of apparatus used and degree of exposure provided during part fabrication. Other important properties of such compositions include a high sensitivity for the radiation employed in the course of curing and a minimum amount of curl or shrinkage deformation, permitting high shape definition of the green model. Of course, not only the green model but also the final cured article should have sufficiently optimized mechanical properties.

It is also often imperative that the radiation curable compositions used in additive manufacturing processes are capable of imparting robust mechanical properties such as strength, toughness and heat resistance, into the three-dimensional parts cured therefrom.

Toughness is the extent to which a certain material, when stressed, is able to absorb energy and plastically deform without fracturing. It can be measured in several ways under different stress conditions, and may vary for a given material depending on the axis through which a stress is applied. Generally speaking, in order to possess sufficient toughness, a material should be both strong and ductile. Strength or ductility alone does not necessarily render a materials tough. Certain high-strength but brittle materials, such as ceramics, are not typically considered to be tough. Conversely, high-ductility but weak materials such as many rubbers are also do not possess significant toughness. To be tough, therefore, a material should be able to withstand both high stresses and high strains.

To be suitable for many industrial applications, the parts created via additive fabrication processes are required to possess a significant toughness. Certain standardized methods which are used widely for evaluating the relative toughness of materials, especially for those cured via additive fabrication processes, include the Young's modulus of elasticity, elongation at break, as well as the Charpy and Izod impact tests. The Young's modulus of elasticity and elongation at break tend to approximates toughness in the form of resilience over a relatively longer time period, whereas the Charpy and Izod impact tests are considered to be a better proxy for toughness under conditions in which a shock is imparted over a shorter time period.

Additionally, many additive fabrication applications require that radiation curable compositions used therein be able to impart sufficient heat resistance to the parts cured therefrom. Such a property, especially in combination with a high toughness, enables thermoset plastics (such as those formed from radiation curable compositions for additive fabrication) to approximate the properties of injection molded engineering plastics, which are made from thermoplastic polymers. The degree to which a radiation curable (i.e. thermoset) material is able to withstand heat is often characterized in the additive manufacturing industry by such material's heat deflection temperature (HDT). HDT is the temperature at which a sample of the cured material deforms by a fixed distance under a specified load. It gives an indication of how the material behaves when stressed at elevated temperatures. The ultimate HDT for radiation curable thermoset materials is determined by a number of factors, including the polymer network's crosslink density, its chemical structure, the type of tougheners/fillers employed, and the degree of cure. A high HDT is important because it signals that a material is able to retain a high degree of its maximum strength even at elevated temperatures.

Existing conventional radiation curable materials suitable for workability via additive fabrication processes are either sufficiently tough, or are sufficiently heat resistant, but not both. In materials science, tradeoffs between properties are commonplace. Certain properties generally can be improved, but often at the cost of reducing others. Perhaps the most limiting and challenging of these tradeoffs, especially when considering the constraints necessitated by formulation of radiation curable compositions suitable for use in additive fabrication processes, is that of toughness and heat resistance.

Although other factors such as molecular structure can contribute to polymer morphology, adjusting a composition's crosslink density is a well-known method in the art of formulation of radiation curable compositions for additive fabrication to modify such composition's toughness and heat resistance. Crosslink density can be defined as the number of effective cross-links per unit volume of the cured polymer. With respect to crosslink density modifications, there exists a well-known inverse relationship between toughness and heat resistance. That is, as crosslink density increases, a thermoset material's HDT increases, but its toughness concomitantly decreases. Conversely, as the cross-link density decreases, the toughness increases but HDT performance is known to suffer. A discussion of the effects of modification of cross-link density in thermoset resins is discussed in, e.g., pp. 8-10 of "Handbook of Thermoset Plastics", Third Edition (Edited by Hanna Dodiuk and Sidney H. Goodman).

There exist several known approaches to toughening, including the use of chain transfer agents, flexibilizing additives including polyols, long side chain or main chain functional monomers and oligomers. While improving toughness, these known approaches also compromise heat resistance as measured by HDT.

For prototyping and other niche applications, this tradeoff has been generally considered acceptable. However, to expand the range of applications for radiation curable compositions produced via additive fabrication processes, new materials are desired that have the combination of both high toughness and high heat resistance. Achieving this combination of properties would open the door to many new applications, including high temperature gas/liquid flow prototyping, and the manufacturing of end-use parts. Indeed, such improved thermoset materials would bridge the current gap to engineering thermoplastics.

Finally, the viscosity of liquid radiation curable compositions is of particular importance in many additive fabrication processes, such as vat-based processes like stereolithography as described above. Many additives or constituents of the composition which might improve the toughness or HDT of the three-dimensional parts cured therefrom make such existing liquid radiation curable resins are highly viscous; that is, they are sufficiently flow-resistant such that they will not readily form a smooth layer of liquid photocurable resin over the just formed solid layer to ensure accurate cure by actinic radiation. With highly viscous resins, forming a new layer of liquid photocurable resin over the top of a previously-cured layer becomes a time consuming process. Other concerns with regards to high viscosity liquid radiation curable compositions for additive fabrication processes such as stereolithography are described in, e.g. US20150044623, assigned to DSM IP Assets, B.V.

From the foregoing, it is evident that a heretofore unmet need exists to provide improved radiation curable compositions suitable for use in additive fabrication processes that possess sufficient green strength, low viscosity, and which also are capable of forming three-dimensional parts which possess simultaneously improved toughness and excellent heat resistance, such that they are ideal for a greater number of applications currently only suitable for engineering thermoplastic materials.

BRIEF SUMMARY

A first aspect of the claimed invention is a radiation curable composition for additive fabrication with improved toughness comprising:

a rubber toughenable base resin further comprising
- a cationically polymerizable component;
- a radically polymerizable component;
- a cationic photoinitiator;
- a free radical photoinitiator; and
- optionally, customary additives; and a liquid phase-separating toughening agent;

wherein the liquid phase-separating toughening agent is present in an amount, relative to the weight of the rubber toughenable base resin, in a ratio from about 1:99 to about 1:3, more preferably about 1:99 to about 1:4, more preferably about 1:99 to about 1:9, more preferably about 1:50 to about 1:12, more preferably about 1:19; and wherein the average molecular weight between crosslinks ($M_C$) of the rubber toughenable base resin is greater than 130 g/mol, more preferably greater than 150 g/mol; in another embodiment more preferably greater than 160 g/mol; and in another embodiment greater than 180 g/mol.

A second aspect of the claimed invention is a radiation curable composition for additive fabrication with improved toughness comprising:

a rubber toughenable base resin further comprising
- (1) optionally, a cationically polymerizable component;
- (2) a radically polymerizable component;
- (3) optionally, a cationic photoinitiator;
- (4) a free radical photoinitiator; and
- (5) optionally, customary additives; and a liquid phase-separating toughening agent;

wherein the liquid phase-separating toughening agent is an epoxidized pre-reacted hydrophobic macromolecule.

A third aspect of the claimed invention is a process of forming a three-dimensional object comprising the steps of forming and selectively curing a liquid layer of the radiation curable composition for additive fabrication with improved toughness according to either the first or second aspects of the claimed invention with actinic radiation and repeating the steps of forming and selectively curing the liquid layer of the radiation curable composition for additive fabrication according to the first or second aspects of the claimed invention a plurality of times to obtain a three-dimensional object.

A fourth aspect of the claimed invention is the three-dimensional object formed by the process according to the third aspect of the claimed invention from the radiation curable composition for additive fabrication with improved toughness according to either the first or second aspects of the claimed invention.

DETAILED DESCRIPTION

Throughout this document, if a molecule is referred to as "high molecular weight", it shall be understood that such molecule possesses a molecular weight of greater than about 2,000 daltons.

A first aspect of the claimed invention is a radiation curable composition for additive fabrication with improved toughness comprising:

- a rubber toughenable base resin further comprising
  - a cationically polymerizable component;
  - a radically polymerizable component;
  - a cationic photoinitiator;
  - a free radical photoinitiator; and
  - optionally, customary additives; and
- a liquid phase-separating toughening agent;
- wherein the liquid phase-separating toughening agent is present in an amount, relative to the weight of the rubber toughenable base resin, in a ratio from about 1:99 to about 1:3, more preferably about 1:99 to about 1:4, more preferably about 1:99 to about 1:9, more preferably about 1:50 to about 1:12, more preferably about 1:19%; and
- wherein the average molecular weight between crosslinks ($M_C$) of the rubber toughenable base resin is greater than 130 g/mol, more preferably greater than 150 g/mol; in another embodiment more preferably greater than 160 g/mol; and in another embodiment greater than 180 g/mol.

Rubber Toughenable Base Resins

All embodiments of radiation curable compositions with improved toughness for additive fabrication according to the present invention possess, as at least a constituent part, a rubber toughenable base resin. This base resin forms a polymer matrix within which toughening agents, which themselves can be liquid and soluble in the base resin prior to curing, phase separate forming domains from the surrounding polymer network of the base resin during the curing process. Although such a rubber toughenable base resin, on its own, sufficiently enables the creation of three dimensional parts via an additive fabrication process, the three-dimensional parts created therefrom may lack the requisite toughness to be considered suitable for many end-use applications. As used herein, "rubber toughenable" does not require that rubbers explicitly be used to toughen the base resin; rather, it merely signifies that such resins are able to be toughened by virtue of a soft-phase separation mechanism.

Rubber toughenable base resins according to the present invention may possess sub-constituents divided into five potential categories: optionally, at least one cationically polymerizable component; at least one radically-polymerizable component; optionally, a cationic photoinitiator; a free-radical photoinitiator; and customary additives. Each of these potential components of a base resin according to the present invention is henceforth discussed in turn.

Cationically Polymerizable Component

In accordance with an embodiment, the rubber toughenable base resin comprises at least one cationically polymerizable component; that is a component which undergoes polymerization initiated by cations or in the presence of acid generators. The cationically polymerizable components may be monomers, oligomers, and/or polymers, and may contain aliphatic, aromatic, cycloaliphatic, arylaliphatic, heterocyclic moiety(ies), and any combination thereof. Suitable cyclic ether compounds can comprise cyclic ether groups as side groups or groups that form part of an alicyclic or heterocyclic ring system.

The cationic polymerizable component is selected from the group consisting of cyclic ether compounds, cyclic acetal compounds, cyclic thioethers compounds, spiro-orthoester compounds, cyclic lactone compounds, and vinyl ether compounds, and any combination thereof.

Suitable cationically polymerizable components include cyclic ether compounds such as epoxy compounds and oxetanes, cyclic lactone compounds, cyclic acetal compounds, cyclic thioether compounds, spiro orthoester compounds, and vinylether compounds. Specific examples of cationically polymerizable components include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl)adipate, vinylcyclohexene oxide, 4-vinylepoxycyclohexane, vinylcyclohexene dioxide, limonene oxide, limonene dioxide, bis(3,4-epoxy-6-methylcyclohexylmethyl)adipate, 3,4-epoxy-6-methylcyclohexyl-3',4'-epoxy-6'-methylcyclohexanecarboxylate, ε-caprolactone-modified 3,4-epoxycyclohexylmethyl-3',4'-epoxycyclohexane carboxylates, trimethylcaprolactone-modified 3,4-epoxycyclohexylmethyl-3',4'-epoxycyclohexane carboxylates, β-methyl-δ-valerolactone-modified 3,4-epoxycyclohexcylmethyl-3',4'-epoxycyclohexane carboxylates, methylenebis(3,4-epoxycyclohexane), bicyclohexyl-3,3'-epoxide, bis(3,4-epoxycyclohexyl) with a linkage of $—O—$, $—S—$, $—SO—$, $—SO_2—$, $—C(CH_3)_2—$, $—CBr_2—$, $—C(CBr_3)_2—$, $—C(CF_3)_2—$, $—C(CCl_3)_2—$, or $—CH(C_6H_5)—$, dicyclopentadiene diepoxide, di(3,4-epoxycyclohexylmethyl) ether of ethylene glycol, ethylenebis(3,4-epoxycyclohexanecarboxylate), epoxyhexahydrodioctylphthalate, epoxyhexahydro-di-2-ethylhexyl phthalate, 1,4-butanediol diglycidyl ether, 1,6-hexanediol diglycidyl ether, neopentylglycol diglycidyl ether, glycerol triglycidyl ether, trimethylolpropane triglycidyl ether, polyethylene glycol diglycidyl ether, polypropylene glycol diglycidyl ether, diglycidyl esters of aliphatic long-chain dibasic acids, monoglycidyl ethers of aliphatic higher alcohols, monoglycidyl ethers of phenol, cresol, butyl phenol, or polyether alcohols obtained by the addition of alkylene oxide to these compounds, glycidyl esters of higher fatty acids, epoxybutylstearic acid, epoxyoctylstearic acid, epoxidated linseed oil, epoxidated polybutadiene, 1,4-bis[(3-ethyl-3-oxetanylmethoxy)methyl]benzene, 3-ethyl-3-hydroxymethyloxetane, 3-ethyl-3-(3-hydroxypropyl)oxymethyloxetane, 3-ethyl-3-(4-hydroxybutyl)oxymethyloxetane, 3-ethyl-3-(5-hydroxypentyl)oxymethyloxetane, 3-ethyl-3-phenoxymethyloxetane, bis((1-ethyl(3-oxetanyl))methyl)ether, 3-ethyl-3-((2-ethylhexyloxy)methyl)oxetane, 3-ethyl-((triethoxysilylpropoxymethyl)oxetane, 3-(meth)-allyloxymethyl-3-ethyloxetane, 3-hydroxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]-benzene, [1-(3-ethyl-3-oxetanylmethoxy)ethyl]phenyl ether, isobutoxymethyl(3-ethyl-3-oxetanylmethyl)ether, 2-ethylhexyl(3-ethyl-3-oxetanylmethyl)ether, ethyldiethylene glycol(3-ethyl-3-oxetanylmethyl)ether, dicyclopentadiene (3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, and any combination thereof.

The cationically polymerizable component may optionally also contain polyfunctional materials including dendritic polymers such as dendrimers, linear dendritic polymers, dendrigraft polymers, hyperbranched polymers, star branched polymers, and hypergraft polymers with epoxy or oxetane functional groups. The dendritic polymers may contain one type of polymerizable functional group or different types of polymerizable functional groups, for example, epoxy and oxetane functions.

In an embodiment, the rubber toughenable base resin of the present invention also or instead comprises one or more mono or poly glycidylethers of aliphatic alcohols, aliphatic polyols, polyesterpolyols or polyetherpolyols. Examples of preferred components include 1,4-butanedioldiglycidylether, glycidylethers of polyoxyethylene and polyoxypropylene glycols and triols of molecular weights from about 200 to about 10,000; glycidylethers of polytetramethylene glycol or poly(oxyethylene-oxybutylene) random or block copolymers. In a specific embodiment, the cationically polymerizable component comprises a polyfunctional glycidylether that lacks a cyclohexane ring in the molecule. In another specific embodiment, the cationically polymerizable component includes a neopentyl glycol diglycidyl ether. In another specific embodiment, the cationically polymerizable component includes a 1,4 cyclohexanedimethanol diglycidyl ether.

Examples of commercially available preferred polyfunctional glycidylethers are Erisys™ GE 22 (Erisys™ products are available from Emerald Performance Materials™), Heloxy™ 48, Heloxy™ 67, Heloxy™ 68, Heloxy™ 107 (Heloxy™ modifiers are available from Momentive Specialty Chemicals), and Grilonit® F713. Examples of commercially available preferred monofunctional glycidylethers are Heloxy™ 71, Heloxy™ 505, Heloxy™ 7, Heloxy™ 8, and Heloxy™ 61.

In an embodiment, the epoxide is 3,4-epoxycyclohexylmethyl-3',4-epoxycyclohexanecarboxylate (available as CELLOXIDE™ 2021P from Daicel Chemical, or as CYRACURE™ UVR-6105 from Dow Chemical), hydrogenated bisphenol A-epichlorohydrin based epoxy resin (available as EPON™ 1510 from Momentive), 1,4-cyclohexanedimethanol diglycidyl ether (available as HELOXY™ 107 from Momentive), a hydrogenated bisphenol A diglycidyl ether (available as EPON™ 825 from Momentive), and any combination thereof.

The above-mentioned cationically polymerizable compounds can be used singly or in combination of two or more thereof. In embodiments of the invention, the cationic polymerizable component further comprises at least two different epoxy components. In a specific embodiment, the cationic polymerizable component includes a cycloaliphatic epoxy, for example, a cycloaliphatic epoxy with 2 or more than 2 epoxy groups. In another specific embodiment, the cationic polymerizable component includes an epoxy having an aromatic or aliphatic glycidyl ether group with 2 (difunctional) or more than 2 (polyfunctional) epoxy groups. In yet another specific embodiment, the rubber toughenable base resin does not contain a cationic polymerizable component at all.

The rubber toughenable base resin can therefore include suitable amounts of the cationic polymerizable component, for example, in certain embodiments, in an amount from about 0 wt % to about 85% by weight of the rubber toughenable base resin, in further embodiments from about 35 wt % to about 75 wt %, and in further embodiments from about 35 wt % to about 65 wt % of the rubber toughenable base resin.

In other embodiments of the invention, the cationically polymerizable component also includes one or more oxetanes. In a specific embodiment, the cationic polymerizable component includes an oxetane, for example, an oxetane containing 1, 2 or more than 2 oxetane groups. If utilized in the composition, the oxetane component is present in a suitable amount from about 5 to about 30 wt % of the rubber toughenable base resin. In another embodiment, the oxetane component is present in an amount from about 10 to about 25 wt % of the rubber toughenable base resin, and in yet another embodiment, the oxetane component is present in an amount from 15 to about 20 wt % of the rubber toughenable base resin.

Radically Polymerizable Component

In accordance with an embodiment of the invention, the rubber toughenable base resin comprises at least one free-radical polymerizable component, that is, a component which undergoes polymerization initiated by free radicals. The free-radical polymerizable components are monomers, oligomers, and/or polymers; they are monofunctional or polyfunctional materials, i.e., have 1, 2, 3, 4, 5, 6, 7, 8, 9, 10 . . . 20 . . . 30 . . . 40 . . . 50 . . . 100, or more functional groups that can polymerize by free radical initiation, may contain aliphatic, aromatic, cycloaliphatic, arylaliphatic, heterocyclic moiety(ies), or any combination thereof. Examples of polyfunctional materials include dendritic polymers such as dendrimers, linear dendritic polymers, dendrigraft polymers, hyperbranched polymers, star branched polymers, and hypergraft polymers; see, e.g., US 2009/0093564 A1. The dendritic polymers may contain one type of polymerizable functional group or different types of polymerizable functional groups, for example, acrylates and methacrylate functions.

Examples of free-radical polymerizable components include acrylates and methacrylates such as isobornyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, benzyl (meth)acrylate, 4-butylcyclohexyl (meth)acrylate, acryloyl morpholine, (meth)acrylic acid, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, caprolactone acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, tridecyl (meth)acrylate, undecyl (meth)acrylate, lauryl (meth)acrylate, stearyl (meth)acrylate, isostearyl (meth)acrylate, tetrahydrofurfuryl (meth)acrylate, butoxyethyl (meth)acrylate, ethoxydiethylene glycol (meth)acrylate, benzyl (meth)acrylate, phenoxyethyl (meth)acrylate, polyethylene glycol mono(meth)acrylate, polypropylene glycol mono(meth)

acrylate, methoxyethylene glycol (meth)acrylate, ethoxyethyl (meth)acrylate, methoxypolyethylene glycol (meth) acrylate, methoxypolypropylene glycol (meth)acrylate, diacetone (meth)acrylamide, beta-carboxyethyl (meth)acrylate, phthalic acid (meth)acrylate, dimethylaminoethyl (meth)acrylate, diethylaminoethyl (meth)acrylate, butylcarbamylethyl (meth)acrylate, n-isopropyl (meth)acrylamide fluorinated (meth)acrylate, 7-amino-3,7-dimethyloctyl (meth)acrylate.

Examples of polyfunctional free-radical polymerizable components include those with (meth)acryloyl groups such as trimethylolpropane tri(meth)acrylate, pentaerythritol (meth)acrylate, ethylene glycol di(meth)acrylate, bisphenol A diglycidyl ether di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate; 3,9-bis(1,1-dimethyl-2-hydroxyethyl)-2,4,8,10-tetraoxaspiro [5.5]undecane di(meth)acrylate; dipentaerythritol monohydroxypenta(meth)acrylate, propoxylated trimethylolpropane tri(meth)acrylate, propoxylated neopentyl glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri(meth)acrylate, phosphoric acid mono- and di(meth)acrylates, $C_7$-$C_{20}$ alkyl di(meth)acrylates, tris(2-hydroxyethyl)isocyanurate tri (meth)acrylate, tris(2-hydroxyethyl)isocyanurate di(meth) acrylate, pentaerythritol tri(meth)acrylate, pentaerythritol tetra(meth)acrylate, dipentaerythritol hexa(meth)crylate, tricyclodecane diyl dimethyl di(meth)acrylate and alkoxylated versions (e.g., ethoxylated and/or propoxylated) of any of the preceding monomers, and also di(meth)acrylate of a diol which is an ethylene oxide or propylene oxide adduct to bisphenol A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, and adducts of hydroxyethyl acrylate.

In accordance with an embodiment, the radically polymerizable component is a polyfunctional (meth)acrylate. The polyfunctional (meth)acrylates may include all methacryloyl groups, all acryloyl groups, or any combination of methacryloyl and acryloyl groups. In an embodiment, the free-radical polymerizable component is selected from the group consisting of bisphenol A diglycidyl ether di(meth)acrylate, ethoxylated or propoxylated bisphenol A or bisphenol F di(meth)acrylate, dicyclopentadiene dimethanol di(meth) acrylate, [2-[1,1-dimethyl-2-[(1-oxoallyl)oxy]ethyl]-5-ethyl-1,3-dioxan-5-yl]methyl acrylate, dipentaerythritol monohydroxypenta(meth)acrylate, dipentaerythritol penta (meth)acrylate, dipentaerythritol hexa(meth)crylate, propoxylated trimethylolpropane tri(meth)acrylate, and propoxylated neopentyl glycol di(meth)acrylate, and any combination thereof.

In a preferred embodiment, the polyfunctional (meth) acrylate has more than 2, more preferably more than 3, and more preferably greater than 4 functional groups.

In another preferred embodiment, the radically polymerizable component consists exclusively of a single polyfunctional (meth)acrylate component. In further embodiments, the exclusive radically polymerizable component is tetra-functional, in further embodiments, the exclusive radically polymerizable component is penta-functional, and in further embodiments, the exclusive radically polymerizable component is hexa-functional.

In another embodiment, the free-radical polymerizable component is selected from the group consisting of bisphenol A diglycidyl ether diacrylate, dicyclopentadiene dimethanol diacrylate, [2-[1,1-dimethyl-2-[(1-oxoallyl)oxy] ethyl]-5-ethyl-1,3-dioxan-5-yl]methyl acrylate, dipentaerythritol monohydroxypentaacrylate, propoxylated trimethylolpropane triacrylate, and propoxylated neopentyl glycol diacrylate, and any combination thereof.

In specific embodiments, the rubber toughenable base resin of the invention includes one or more of bisphenol A diglycidyl ether di(meth)acrylate, dicyclopentadiene dimethanol di(meth)acrylate, dipentaerythritol monohydroxypenta(meth)acrylate, propoxylated trimethylolpropane tri (meth)acrylate, and/or propoxylated neopentyl glycol di(meth)acrylate, and more specifically one or more of bisphenol A diglycidyl ether diacrylate, dicyclopentadiene dimethanol diacrylate, dipentaerythritol pentaacrylate, propoxylated trimethylolpropane triacrylate, and/or propoxylated neopentyl glycol diacrylate.

The above-mentioned radically polymerizable compounds can be used singly or in combination of two or more thereof. The rubber toughenable base resin can include any suitable amount of the free-radical polymerizable components, for example, in certain embodiments, in an amount up to about 40 wt % of the composition, in certain embodiments, from about 2 to about 40 wt % of the composition, in other embodiments from about 5 to about 30 wt %, and in further embodiments from about 10 to about 20 wt % of the composition. Particularly in embodiments wherein cationically curable components are not used, the rubber toughenable base resin can include up to 95 wt % of one or more radically polymerizable components.

The rubber toughenable base resins of the present invention also include a photoinitiating system. The photoinitiating system can include a free-radical photoinitiator and/or a cationic photoinitiator. In accordance with an embodiment, the radiation curable composition includes a photoinitiating system contains at least one photoinitiator having a cationic initiating function, and at least one photoinitiator having a free radical initiating function. Additionally, the photoinitiating system can include a photoinitiator that contains both free-radical initiating function and cationic initiating function on the same molecule. In an embodiment, the photoinitiating system includes one or more free-radical photoinitiators and no cationic photoinitiators. The photoinitiator is a compound that chemically changes due to the action of light or the synergy between the action of light and the electronic excitation of a sensitizing dye to produce at least one of a radical, an acid, and a base.

Cationic Photoinitiator

In accordance with an embodiment, the rubber toughenable base resin includes a cationic photoinitiator. Cationic photoinitiators initiate cationic ring-opening polymerization upon irradiation of light. In a preferred embodiment, a sulfonium salt photoinitiator is used, for example, dialkylphenacylsulfonium salts, aromatic sulfonium salts, triaryl sulfonium salts, and any combination thereof.

In accordance with an embodiment, the rubber toughenable base resin includes a cationic photoinitiator. The cationic photoinitiator initiates cationic ring-opening polymerization upon irradiation of light.

In an embodiment, any suitable cationic photoinitiator can be used, for example, those with cations selected from the group consisting of onium salts, halonium salts, iodosyl salts, selenium salts, sulfonium salts, sulfoxonium salts, diazonium salts, metallocene salts, isoquinolinium salts, phosphonium salts, arsonium salts, tropylium salts, dialkylphenacylsulfonium salts, thiopyrilium salts, diaryl iodonium salts, triaryl sulfonium salts, ferrocenes, di(cyclopentadienyliron)arene salt compounds, and pyridinium salts, and any combination thereof.

In another embodiment, the cation of the cationic photoinitiator is selected from the group consisting of aromatic diazonium salts, aromatic sulfonium salts, aromatic iodonium salts, metallocene based compounds, aromatic phosphonium salts, and any combination thereof. In another embodiment, the cation is a polymeric sulfonium salt, such as in U.S. Pat. Nos. 5,380,923 or 5,047,568, or other aromatic heteroatom-containing cations and naphthyl-sulfonium salts such as in U.S. Pat. Nos. 7,611,817, 7,230,122, US2011/0039205, US2009/0182172, U.S. Pat. No. 7,678,528, EP2308865, WO2010046240, or EP2218715. In another embodiment, the cationic photoinitiator is selected from the group consisting of triarylsulfonium salts, diaryliodonium salts, and metallocene based compounds, and any combination thereof. Onium salts, e.g., iodonium salts and sulfonium salts, and ferrocenium salts, have the advantage that they are generally more thermally stable.

In a particular embodiment, the cationic photoinitiator has an anion selected from the group consisting of $BF_4^-$, $AsF_6^-$, $SbF_6^-$, $PF_6^-$, $[B(CF_3)_4]^-$, $B(C_6F_5)_4^-$, $B[C_6H_3\text{-}3,5(CF_3)_2]_4^-$, $B(C_6H_4CF_3)_4^-$, $B(C_6H_3F_2)_4^-$, $B[C_6F_4\text{-}4(CF_3)]_4^-$, $Ga(C_6F_5)_4^-$, $[(C_6F_5)_3B{-}C_3H_3N_2{-}B(C_6F_5)_3]^-$, $[(C_6F_5)_3B{-}NH_2{-}B(C_6F_5)_3]^-$, tetrakis(3,5-difluoro-4-alkyloxyphenyl)borate, tetrakis(2,3,5,6-tetrafluoro-4-alkyloxyphenyl)borate, perfluoroalkylsulfonates, tris[(perfluoroalkyl)sulfonyl]methides, bis[(perfluoroalkyl)sulfonyl]imides, perfluoroalkylphosphates, tris(perfluoroalkyl)trifluorophosphates, bis(perfluoroalkyl)tetrafluorophosphates, tris(pentafluoroethyl)trifluorophosphates, and $(CH_6B_{11}Br_6)^-$, $(CH_6B_{11}Cl_6)^-$ and other halogenated carborane anions.

A survey of other onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol. 3 (edited by P. K. T. Oldring).

In an embodiment, the cationic photoinitiator has a cation selected from the group consisting of aromatic sulfonium salts, aromatic iodonium salts, and metallocene based compounds with at least an anion selected from the group consisting of $SbF_6^-$, $PF_6^-$, $B(C_6F_5)_4^-$, $[B(CF_3)_4]^-$, tetrakis(3,5-difluoro-4-methoxyphenyl)borate, perfluoroalkylsulfonates, perfluoroalkylphosphates, tris[(perfluoroalkyl)sulfonyl]methides, and $[(C_2F_5)_3PF_3]^-$.

Examples of cationic photoinitiators useful for curing at 300-475 nm, particularly at 365 nm UV light, without a sensitizer include 4-[4-(3-chlorobenzoyl)phenylthio]phenylbis(4-fluorophenyl)sulfonium hexafluoroantimonate, 4-[4-(3-chlorobenzoyl)phenylthio]phenylbis(4-fluorophenyl) sulfonium tetrakis(pentafluorophenyl)borate, 4-[4-(3-chlorobenzoyl)phenylthio]phenylbis(4-fluorophenyl) sulfonium tetrakis(3,5-difluoro-4-methyloxyphenyl)borate, 4-[4-(3-chlorobenzoyl)phenylthio]phenylbis(4-fluorophenyl)sulfonium tetrakis(2,3,5,6-tetrafluoro-4-methyloxyphenyl)borate, tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), tris(4-(4-acetylphenyl)thiophenyl)sulfonium hexafluorophosphate (Irgacure® 270 from BASF), and HS-1 available from San-Apro Ltd.

Preferred cationic photoinitiators include, either alone or in a mixture: bis[4-diphenylsulfoniumphenyl]sulfide bishexafluoroantimonate; thiophenoxyphenylsulfonium hexafluoroantimonate (available as Chivacure 1176 from Chitec), tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), and tris(4-(4-acetylphenyl)thiophenyl)sulfonium hexafluorophosphate (Irgacure® 270 from BASF), [4-(1-methylethyl)phenyl](4-methylphenyl) iodonium tetrakis(pentafluorophenyl)borate (available as Rhodorsil 2074 from Rhodia), 4-[4-(2-chlorobenzoyl)phenylthio]phenylbis(4-fluorophenyl)sulfonium hexafluoroantimonate (as SP-172 from Adeka), SP-300 from Adeka, and aromatic sulfonium salts with anions of $(PF_{6-m}(C_nF_{2n+1})_m)^-$ where m is an integer from 1 to 5, and n is an integer from 1 to 4 (available as CPI-200K or CPI-200S, which are monovalent sulfonium salts from San-Apro Ltd., TK-1 available from San-Apro Ltd., or HS-1 available from San-Apro Ltd.).

In various embodiments, the liquid radiation curable resin composition for additive fabrication may be irradiated by laser or LED light operating at any wavelength in either the UV or visible light spectrum. In particular embodiments, the irradiation is from a laser or LED emitting a wavelength of from 340 nm to 415 nm. In particular embodiments, the laser or LED source emits a peak wavelength of about 340 nm, 355 nm, 365 nm, 375 nm, 385 nm, 395 nm, 405 nm, or 415 nm.

In an embodiment of the invention, the rubber toughenable base resin comprises an aromatic triaryl sulfonium salt cationic photoinitiator.

Use of aromatic triaryl sulfonium salts in additive fabrication applications is known. Please see US 20120251841 to DSM IP Assets, B.V. (which is hereby incorporated in its entirety), U.S. Pat. No. 6,368,769, to Asahi Denki Kogyo, which discusses aromatic triaryl sulfonium salts with tetraryl borate anions, including tetrakis(pentafluorophenyl)borate, and use of the compounds in stereolithography applications. Triarylsulfonium salts are disclosed in, for example, J Photopolymer Science & Tech (2000), 13(1), 117-118 and J Poly Science, Part A (2008), 46(11), 3820-29. Triarylsulfonium salts $Ar_3S^+MXn^-$ with complex metal halide anions such as $BF_4^-$, $AsF_6^-$, $PF_6^-$, and $SbF_6^-$, are disclosed in J Polymr Sci, Part A (1996), 34(16), 3231-3253.

The use of aromatic triaryl sulfonium salts as the cationic photoinitiator in radiation curable resins is desirable in additive fabrication processes because the resulting resin attains a fast photospeed, good thermal-stability, and good photo-stability.

In an embodiment, the cationic photoinitiator is an aromatic triaryl sulfonium salt that is more specifically an R-substituted aromatic thioether triaryl sulfonium tetrakis(pentafluorophenyl)borate cationic photoinitiator, having a tetrakis(pentafluorophenyl)borate anion. A suitable R-substituted aromatic thioether triaryl sulfonium tetrakis(pentafluorophenyl)borate cationic photoinitiator is tris(4-(4-acetylphenyl)thiophenyl)sulfonium tetrakis(pentafluorophenyl)borate. Tris(4-(4-acetylphenyl)thiophenyl)sulfonium tetrakis(pentafluorophenyl)borate is known commercially as IRGACURE® PAG-290 and is available from Ciba/BASF.

In another embodiment, the cationic photoinitiator is an aromatic triaryl sulfonium salt that possesses an anion represented by $SbF_6^-$, $PF_6^-$, $BF_4^-$, $(CF_3CF_2)_3PF_3^-$, $(C_6F_5)_4B^-$, $((CF_3)_2C_6H_3)_4B^-$, $(C_6F_5)_4Ga^-$, $((CF_3)_2C_6H_3)_4Ga^-$, trifluoromethanesulfonate, nonafluorobutanesulfonate, methanesulfonate, butanesulfonate, benzenesulfonate, or p-toluenesulfonate. Such photoinitiators are described in, for example, U.S. Pat. No. 8,617,787.

A particularly preferred aromatic triaryl sulfonium cationic photoinitiator has an anion that is a fluoroalkyl-substituted fluorophosphate. Commercial examples of an aromatic triaryl sulfonium cationic photoinitiator having a fluoroalkyl-substituted fluorophosphate anion is the CPI-200 series (for example CPI-200K® or CPI-2105®) or 300 series, available from San-Apro Limited.

The rubber toughenable base resin can include any suitable amount of the cationic photoinitiator, for example, in certain embodiments, from 0% to about 15% by weight of the rubber toughenable base resin, in certain embodiments, up to about 5% by weight of the rubber toughenable base resin, and in further embodiments from about 2% to about 10% by weight of the rubber toughenable base resin, and in other embodiments, from about 0.1% to about 5% by weight of the rubber toughenable base resin. In a further embodiment, the amount of cationic photoinitiator is from about 0.2 wt % to about 4 wt % of the rubber toughenable base resin, and in other embodiments from about 0.5 wt % to about 3 wt % of the rubber toughenable base resin. In embodiments of the present invention wherein cationically curable components are not used, it may not be desirable or necessary to additionally include a cationic photoinitiator as described herein.

In some embodiments, depending on the wavelength of light used for curing the radiation curable composition for additive fabrication with improved toughness, it is desirable for the rubber toughenable base resin to include a photosensitizer. The term "photosensitizer" is used to refer to any substance that either increases the rate of photoinitiated polymerization or shifts the wavelength at which polymerization occurs; see textbook by G. Odian, Principles of Polymerization, $3^{rd}$ Ed., 1991, page 222. A variety of compounds can be used as photosensitizers, including heterocyclic and fused-ring aromatic hydrocarbons, organic dyes, and aromatic ketones. Examples of photosensitizers include those selected from the group consisting of methanones, xanthenones, pyrenemethanols, anthracenes, pyrene, perylene, quinones, xanthones, thioxanthones, benzoyl esters, benzophenones, and any combination thereof. Particular examples of photosensitizers include those selected from the group consisting of [4-[(4-methylphenyl)thio]phenyl]phenyl-methanone, isopropyl-9H-thioxanthen-9-one, 1-pyrenemethanol, 9-(hydroxymethyl)anthracene, 9,10-diethoxyanthracene, 9,10-dimethoxyanthracene, 9,10-dipropoxyanthracene, 9,10-dibutyloxyanthracene, 9-anthracenemethanol acetate, 2-ethyl-9,10-dimethoxyanthracene, 2-methyl-9,10-dimethoxyanthracene, 2-t-butyl-9,10-dimethoxyanthracene, 2-ethyl-9,10-diethoxyanthracene and 2-methyl-9,10-diethoxyanthracene, anthracene, anthraquinones, 2-methylanthraquinone, 2-ethylanthraquinone, 2-tertbutylanthraquinone, 1-chloroanthraquinone, 2-amylanthraquinone, thioxanthones and xanthones, isopropyl thioxanthone, 2-chlorothioxanthone, 2,4-diethylthioxanthone, 1-chloro-4-propoxythioxanthone, methyl benzoyl formate (Darocur MBF from BASF), methyl-2-benzoyl benzoate (Chivacure OMB from Chitec), 4-benzoyl-4'-methyl diphenyl sulphide (Chivacure BMS from Chitec), 4,4'-bis (diethylamino) benzophenone (Chivacure EMK from Chitec), and any combination thereof.

In an embodiment, the rubber toughenable base resin may also contain various photoinitiators of different sensitivity to radiation of emission lines with different wavelengths to obtain a better utilization of a UV light source. The use of known photoinitiators of different sensitivity to radiation of emission lines is well known in the art of additive fabrication, and may be selected in accordance with radiation sources of, for example, 351, nm 355 nm, 365 nm, 385 nm, and 405 nm. In this context it is advantageous for the various photoinitiators to be selected such, and employed in a concentration such, that equal optical absorption is produced with the emission lines used.

The rubber toughenable base resin can include any suitable amount of the photosensitizer, for example, in certain embodiments, in an amount up to about 10% by weight of the rubber toughenable base resin, in certain embodiments, up to about 5% by weight of the rubber toughenable base resin, and in further embodiments from about 0.05% to about 2% by weight of the rubber toughenable base resin.

Free-Radical Photoinitiator

Typically, free radical photoinitiators are divided into those that form radicals by cleavage, known as "Norrish Type I" and those that form radicals by hydrogen abstraction, known as "Norrish type II". The Norrish type II photoinitiators require a hydrogen donor, which serves as the free radical source. As the initiation is based on a bimolecular reaction, the Norrish type II photoinitiators are generally slower than Norrish type I photoinitiators which are based on the unimolecular formation of radicals. On the other hand, Norrish type II photoinitiators possess better optical absorption properties in the near-UV spectroscopic region. Photolysis of aromatic ketones, such as benzophenone, thioxanthones, benzil, and quinones, in the presence of hydrogen donors, such as alcohols, amines, or thiols leads to the formation of a radical produced from the carbonyl compound (ketyl-type radical) and another radical derived from the hydrogen donor. The photopolymerization of vinyl monomers is usually initiated by the radicals produced from the hydrogen donor. The ketyl radicals are usually not reactive toward vinyl monomers because of the steric hindrance and the delocalization of an unpaired electron.

To successfully formulate a radiation curable resin for additive fabrication, it is necessary to review the wavelength sensitivity of the photoinitiator(s) present in the resin composition to determine if they will be activated by the radiation source chosen to provide the curing light.

In accordance with an embodiment, the rubber toughenable base resin includes at least one free radical photoinitiator, e.g., those selected from the group consisting of benzoylphosphine oxides, aryl ketones, benzophenones, hydroxylated ketones, 1-hydroxyphenyl ketones, ketals, metallocenes, and any combination thereof.

In an embodiment, the rubber toughenable base resin includes at least one free-radical photoinitiator selected from the group consisting of 2,4,6-trimethylbenzoyl diphenylphosphine oxide and 2,4,6-trimethylbenzoyl phenyl, ethoxy phosphine oxide, bis(2,4,6-trimethylbenzoyl)-phenylphosphineoxide, 2-methyl-1-[4-(methylthio)phenyl]-2-morpholinopropanone-1, 2-benzyl-2-(dimethylamino)-1-[4-(4-morpholinyl) phenyl]-1-butanone, 2-dimethylamino-2-(4-methyl-benzyl)-1-(4-morpholin-4-yl-phenyl)-butan-1-one, 4-benzoyl-4'-methyl diphenyl sulphide, 4,4'-bis (diethylamino) benzophenone, and 4,4'-bis(N,N'-dimethylamino) benzophenone (Michler's ketone), benzophenone, 4-methyl benzophenone, 2,4,6-trimethyl benzophenone, dimethoxybenzophenone, 1-hydroxycyclohexyl phenyl ketone, phenyl (1-hydroxyisopropyl)ketone, 2-hydroxy-1-[4-(2-hydroxyethoxy) phenyl]-2-methyl-1-propanone, 4-isopropylphenyl(1-hydroxyisopropyl)ketone, oligo-[2-hydroxy-2-methyl-1-[4-(1-methylvinyl)phenyl] propanone], camphorquinone, 4,4'-bis(diethylamino) benzophenone, benzil dimethyl ketal, bis(eta 5-2-4-cyclopentadien-1-yl) bis[2,6-difluoro-3-(1H-pyrrol-1-yl) phenyl] titanium, and any combination thereof.

For light sources emitting in the 300-475 nm wavelength range, especially those emitting at 365 nm, 390 nm, or 395 nm, examples of suitable free-radical photoinitiators absorbing in this area include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-1 (Irgacure 907 from Ciba), 2-benzyl-2-(dimethylamino)-1-[4-(4-morpholinyl) phenyl]-1-butanone (Irgacure 369 from Ciba), 2-dimethylamino-2-(4-methyl-benzyl)-1-(4-morpholin-4-yl-phenyl)-butan-1-one (Irgacure 379 from Ciba), 4-benzoyl-4'-methyl diphenyl sulphide (Chivacure BMS from Chitec), 4,4'-bis(diethylamino) benzophenone (Chivacure EMK from Chitec), and 4,4'-bis(N,N'-dimethylamino) benzophenone (Michler's ketone). Also suitable are mixtures thereof.

Additionally, photosensitizers are useful in conjunction with photoinitiators in effecting cure with LED light sources emitting in this wavelength range. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthones and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulphide (Chivacure BMS from Chitec), 4,4'-bis(diethylamino) benzophenone (Chivacure EMK from Chitec).

It is possible for UV radiation sources to be designed to emit light at shorter wavelengths. For light sources emitting at wavelengths from between about 100 and about 300 nm, it is possible to employ a photosensitizer with a photoinitiator. When photosensitizers, such as those previously listed are present in the formulation, other photoinitiators absorbing at shorter wavelengths can be used. Examples of such photoinitiators include: benzophenones, such as benzophenone, 4-methyl benzophenone, 2,4,6-trimethyl benzophenone, dimethoxybenzophenone, and 1-hydroxyphenyl ketones, such as 1-hydroxycyclohexyl phenyl ketone, phenyl (1-hydroxyisopropyl)ketone, 2-hydroxy-1-[4-(2-hroxyethoxy) phenyl]-2-methyl-1-propanone, and 4-isopropylphenyl(1-hydroxyisopropyl)ketone, benzil dimethyl ketal, and oligo-[2-hydroxy-2-methyl-1-[4-(1-methylvinyl)phenyl] propanone] (Esacure KIP 150 from Lamberti).

Radiation sources can also be designed to emit at higher wavelengths. For radiation sources emitting light at wavelengths from about 475 nm to about 900 nm, examples of suitable free radical photoinitiators include: camphorquinone, 4,4'-bis(diethylamino) benzophenone (Chivacure EMK from Chitec), 4,4'-bis(N,N'-dimethylamino) benzophenone (Michler's ketone), bis(2,4,6-trimethylbenzoyl)-phenylphosphineoxide ("BAPO," or Irgacure 819 from Ciba), metallocenes such as bis (eta 5-2-4-cyclopentadien-1-yl) bis [2,6-difluoro-3-(1H-pyrrol-1-yl) phenyl] titanium (Irgacure 784 from Ciba), and the visible light photoinitiators from Spectra Group Limited, Inc. such as H-Nu 470, H-Nu-535, H-Nu-635, H-Nu-Blue-640, and H-Nu-Blue-660.

In one embodiment of the instant claimed invention, the light emitted by the radiation source is UVA radiation, which is radiation with a wavelength between about 320 and about 400 nm. In one embodiment of the instant claimed invention, the light emitted by the radiation source is UVB radiation, which is radiation with a wavelength between about 280 and about 320 nm. In one embodiment of the instant claimed invention, the light emitted by the radiation source is UVC radiation, which is radiation with a wavelength between about 100 and about 280 nm.

The rubber toughenable base resin can include any suitable amount of the free-radical photoinitiator as component, for example, in certain embodiments, in an amount up to about 10 wt % of the rubber toughenable base resin, in certain embodiments, from about 0.1 to about 10 wt % of the rubber toughenable base resin, and in further embodiments from about 1 to about 6 wt % of the rubber toughenable base resin.

Customary Additives

In embodiments of the present invention, the rubber toughenable base resin further contains customary additives. Customary additives to the rubber toughenable base resin may include without limitation stabilizers, fillers, dyes, pigments, antioxidants, wetting agents, chain transfer agents such as polyols, leveling agents, defoamers, surfactants, bubble breakers, acid scavengers, thickeners, flame retardants, silane coupling agents, ultraviolet absorbers, resin particles, core-shell particle impact modifiers, and the like. Such components may be added in known amounts and to desired effect.

Stabilizers are often added to the rubber toughenable base resin in order to further prevent a viscosity build-up, for instance a viscosity build-up during usage in a solid imaging process. Useful stabilizers include those described in, e.g., U.S. Pat. No. 5,665,792. In the instant claimed invention, the presence of a stabilizer is optional. In a specific embodiment, the liquid radiation curable resin composition for additive fabrication comprises from 0.1 wt % to 3% of a stabilizer.

If present, such stabilizers are usually hydrocarbon carboxylic acid salts of group IA and IIA metals. Most preferred examples of these salts are sodium bicarbonate, potassium bicarbonate, and rubidium carbonate. Solid stabilizers are generally not preferred in filled resin compositions. Alternative stabilizers include polyvinylpyrrolidones and polyacrylonitriles.

Fillers are often added to radiation curable compositions for additive fabrication to impart increased strength, rigidity and modulus. Useful fillers include those described in, e.g. U.S. Pat. No. 9,228,073, assigned to DSM IP Assets, B.V. Also described in the '073 patent are useful prescriptions for stabilized matrices comprising more than one filler type which may be followed to impart a filled matrix with improved resistance to filler particle precipitation.

Core-shell particles are also often added to radiation curable compositions for additive fabrication to impart increased toughness. Useful core-shell particles include those described in, e.g. publication of patent application number US20100304088, assigned to DSM IP Assets, B.V.

Compatible Base Resin Matrices

Inventors have discovered that not all base resins are sufficiently able to be toughened whilst still sufficiently maintaining heat resistance upon the inclusion of the various liquid phase-separating toughening agents prescribed according to the present invention. Therefore, it has been presently discovered that such liquid phase-separating toughening agents function as desired only in an appropriately compatible toughenable base resin matrix. In embodiments of the present invention, this compatibility has been linked to the base resin's crosslink density.

Although it is well-known that resins with a higher crosslink density are, all else being equal, more brittle and therefore exhibit reduced toughness, Inventors have surprisingly discovered that matrices with a crosslink density outside of certain ranges are also incapable of being further toughened by the incorporation of certain liquid phase-separating toughening agents prescribed herein in any sufficient fashion. Furthermore, such base resins typically exhibit the classical concomitant reduction in heat resistance after the incorporation of such liquid phase-separating toughening agents. By contrast, base resin matrices with a crosslink density that falls within certain ranges will readily toughen when combined with the liquid phase-separating toughening agents prescribed herein, and further surprisingly exhibit a tendency to largely maintain the concomitant HDT values, in contravention of the longstanding principle of the known inverse relationship between toughness and HDT. In an embodiment, compositions according to the current invention exhibit an increase in elongation at break of at least 5%, more preferably at least 20%, more preferably at least 30%, more preferably at least 50%, and in some embodiments at least 100%, all while maintaining an HDT value of within 7 degrees, more preferably 5 degrees, more preferably 3 degrees, more preferably within 1 degree when compared to compositions with incompatible rubber toughenable base resin matrices, or those not including such liquid phase-separating toughening agents.

A preferred method used herein to quantify the crosslink density of a network is by way of calculating the molecular weight between crosslinks, $M_C$. $M_C$, which can be expressed in terms of the unit g/mol, is the average molecular weight between cross-link junction points in a crosslinked network. $M_C$ values may be derived in different ways. One experimental method involves a derivation based upon data evidencing a network's elongation. As used herein, however, "ideal" $M_C$ values are derived by calculations based upon the nature of the individual components of a formulation, along with such components' individual molecular weights and functionalities. A formula for calculating such ideal $M_C$ values of a cured network, taken from James Mark "Physical Properties of Polymers" 3rd Edition, Cambridge University Press, 2004, P. 11-12, is as follows:

$$Mc = \frac{\rho}{\left(\frac{\upsilon}{V}\right)}$$

where: $M_C$=molecular weight between cross-links (in g/mol)

$\rho$=density of network (in g/cubic centimeter)

$\upsilon$=total number of moles of network chains (in mol)

V=volume of network (in cc)

This model as applied herein assumes the network to be a perfectly connected continuum with no looping (i.e. non-active chains) and no dead-ends (i.e. from monofunctional species or initiator fragments). With this model, each cross-linker molecule (functionality >2, i.e. a diacrylate or diepoxide each have a defined $M_C$ functionality of 4) contributes a number of network chains equal to its functionality divided by two, i.e. one network chain is formed for every 2 functionality provided by a cross-linker molecule. These crosslinker molecules are the only components considered for the determination of $\upsilon$. Furthermore, for the avoidance of any doubt, photoinitiators are not included in in the calculations as used herein.

One example to visualize this approach is that for a resin mixture of just difunctional species, only a linear polymer would be formed, thereby precluding any crosslinking network. In such a case, $\upsilon$=0, and therefore the $M_C$ calculated according to this method would approach infinity (i.e. be undefined according to the formula). With the introduction of a single cross-linker that contributes to $\upsilon$, $M_C$ values begin to decrease to a definable value.

It is further assumed that all radiation curable compositions for additive fabrication evaluated herein possess components adding up to 100 grams total and possess a constant density of 1.0 g/cc (nearly all unfilled radiation curable compositions for stereolithography, for example, have comparable densities, with actual values ranging from approximately 1.1 to 1.2). Therefore, for all calculations made herein, V is assumed to be a constant 100 cc.

When determining $M_C$ functionalities, the following should be taken into account: Vinyl ethers or Acrylates=2, Oxirane (ALL, including epoxy, cycloaliphatic, oxetane)=2, primary OH=1, secondary OH=0 (assume nonreactive).

To calculate $\upsilon$ total for the network, calculate u for each component and sum the values accordingly. A demonstration of $\upsilon$ may be derived by way of example by presupposing a resin with a 4-functional component as the only crosslinker (remaining species are difunctional and so they only connect and extend the junction cross-link points) with a molecular weight of 252 g/mol which is further present in an amount relative to the entire composition with which it is associated of 35 wt % (35 grams out of 100 grams). The u for this component, (and thus the entire network since this is the only cross-linker molecule), would therefore be calculated as follows:

$$\begin{aligned} &35 \text{ grams} * (1 \text{ mole}/252 \text{ grams}) * (4 \text{ functionality/mole}) * \\ &\quad (1 \text{ mole network chains}/2 \text{ functionality}) = \\ &\quad 0.278 \text{ moles of network chains contributed by this component} \end{aligned}$$

Since this component in this particular example is the only cross-linker and therefore the only component contributing to the formation of network chains, the overall $M_C$ in this example is calculated as:

$$M_C = (1 \text{ g/cc})/(0.278 \text{ mol}/100 \text{ g}) = 100 \text{ g}/0.278 \text{ mol} = 360 \text{ g/mol}$$

Using this method, $M_C$ values according to the present invention can be derived.

In an embodiment of the invention, compatible rubber toughenable base resin possess an $M_C$ value of at least 130 g/mol, more preferably greater than 150 g/mol. In another embodiment, compatible rubber toughenable base resins possess an $M_C$ value of at least 160 g/mol; and in another embodiment greater than 180 g/mol. In yet another embodiment, the $M_C$ of a compatible rubber toughenable base resin is less than 2,000 g/mol, more preferably less than 1,000 g/mol, more preferably less than 500 g/mol, more preferably less than 400 g/mol, more preferably less than 300 g/mol, more preferably less than 280 g/mol, more preferably less than 260 g/mol, more preferably less than 230 g/mol, more preferably less than 200 g/mol. If the $M_C$ value of the rubber toughenable base resin becomes too low, the highly cross-linked network does not readily toughen even upon the addition of liquid phase-separating toughening agents. If the $M_C$ value is too high, on the other hand, the polymer network of the base resin itself is not sufficiently crosslinked to enable the general properties (modulus, HDT) necessary to form for suitability in many end-use applications common of components created via additive fabrication processes.

Liquid Phase-Separating Toughening Agents

Radiation curable compositions for additive fabrication with improved toughness according to the present invention also possess at least one liquid, phase-separating toughening agent. Such agents are liquid at room temperature and are typically soluble within the base resin prior to cure. Then, upon curing of the entire radiation curable composition into which they are incorporated, the toughening agents phase-separate forming in-situ rubbery domains residing in the interstitial spaces within the crosslink matrix formed by the surrounding thermoset polymer. These phase domains may be light refractive or not, depending on their size and refractive index relative to the remainder of the polymer matrix. If they are sufficiently sized and light refractive, they will impart a white color to the final cured product. This visual effect is particularly desired in certain applications, and obviates the need for the inclusion of additives such as pigments, which have the undesirable effect of precipitating in a vat of material over time, along with the fact that such pigments may impact the associated composition's viscosity and photospeed in an undesirable fashion.

Inventors have discovered that certain size ranges of the resulting phase domains are an important indicator of the relative amount of simultaneous improved rubber toughenability and heat resistance imparted in the corresponding cured object (when compared to the base resin matrix alone), particularly when such phase domains are added to compatible base resin matrices as prescribed elsewhere herein. Inventors have surprisingly found that such rubber toughenability and heat resistance are particularly optimized if the liquid phase-separating toughening agents are selected such that they are configured to yield average phase domains of at least 2 microns and less than 25 microns, more preferably from about 5 microns to about 20 microns, or from about 7 microns to about 15 microns, when measured according to the average phase domain size procedure outlined in the following paragraph.

Average Phase Domain Size Procedure: A few drops of resin are placed on a microscope slide. The microscope slide has 10 mil Mylar squares as shims on the edges. A second microscope slide is then placed on top of the shims, sandwiching and spreading out the liquid to be 10 mil (+/−1 mil) thickness. This glass-resin-glass sandwich is then placed in a conventional stereolithography machine, for example an SLA Viper from 3D Systems, and imaged over using appropriate Ec/Dp and other imaging parameters suitable for the resin being used. A square is drawn over the sandwich in order to cure the entire liquid area. The square is imaged three times to ensure full curing of the liquid. The top glass slide is then removed. The microscope slide with the thin film cured on top is then investigated by the optical microscope. Using 20× magnification, domains of phase separation are clearly visible. The diameters of ten (10) of these domains are measured and tabulated. The average value of these ten values is the average phase domain size.

If selected in accordance with compatible rubber toughenable base resins as prescribed herein above, therefore, such liquid phase-separating toughening agents can impart a substantial toughening affect upon the cured composition, without a substantial sacrifice in the cured composition's heat deflection temperature, as is known to occur with existing reagents and methods for improving toughness into radiation curable compositions for additive fabrication.

In an embodiment, when incorporated into a sufficiently compatible rubber toughenable base resin matrix as described above, the liquid phase-separating toughening agent can be a high molecular weight dimer fatty acid polyol. In an embodiment, the high molecular weight dimer fatty acid polyol possesses a molecular weight of greater than 2000 g/mol, more preferably 3000 g/mol, more preferably greater than 4000 g/mol. In another embodiment, such polyol possesses a molecular weight of 8000 g/mol. In an embodiment, the high molecular weight dimer fatty acid polyol possesses a molecular weight of up to 10,000 g/mol. Molecular weights above this value tend to detrimentally affect the viscosity of the entire radiation curable composition, making such compositions unsuitable for effective use in many additive fabrication processes. In another embodiment, the high molecular weight dimer fatty acid polyol is a propylene oxide or ethylene oxide.

Commercially available components of such high liquid phase-separating toughening agents includes high molecular weight polyols such as the Acclaim series of polypropylene glycols with varying molecular weight, such as Acclaim 4200 and 8200, as well as Croda epoxy-functional toughening agents such as B-tough A2 and Beta Tough 2CR. Also suitable for use from Croda as such a liquid-phase separating toughening agent are the Priplast™ series polyester polyols.

A second aspect of the claimed invention is a radiation curable composition for additive fabrication with improved toughness comprising:

a liquid phase-separating toughening agent; and a rubber toughenable base resin further comprising (1) optionally, a cationically polymerizable component;

(2) a radically polymerizable component;

(3) optionally, a cationic photoinitiator;

(4) a free radical photoinitiator; and (5) optionally, customary additives;

wherein the liquid phase-separating toughening agent is an epoxidized pre-reacted hydrophobic macromolecule.

Liquid Phase-Separating Toughening Agents which are Pre-Reacted Epoxidized Hydrophobic Macromolecules According to other embodiments consistent with the second aspect of the claimed invention, the radiation curable compositions for additive fabrication with improved toughness incorporate at least one liquid phase-separating toughening agent which is an epoxidized, pre-reacted, hydrophobic macromolecule. For purposes herein, "epoxidized" means that such toughening agent is epoxy-functional; that is, it is able to undergo a ring-opening reaction of one or more epoxy moieties present anywhere on its molecule. Such moieties need not be terminating epoxy groups. "Pre-reacted" for purposes herein means that such epoxidization and/or macromolecule synthesis is completed prior to any incorporation of such toughening agent into the surrounding rubber toughenable base resin. "Hydrophobic" means that such macromolecule, once synthesized, possesses an absence of attraction from a proximate mass of water. Without wishing to be bound by any theory, it is believed that a toughening agent's level of hydrophobicity is correlated to an acceleration of its phase-separation from the surrounding rubber toughenable base resin during curing.

In an embodiment, the epoxidized pre-reacted hydrophobic macromolecule is a triblock copolymer possessing terminating epoxy- or acrylate-functional hard blocks and at least one immiscible soft block. In an embodiment, the triblock copolymer is formed by the reaction product of a soft-block originator with a monofunctional anhydride, and then further reacting an epoxy-functional reactant. In an embodiment, the soft-block originator is selected from the group consisting of polybutadienes, polyols, and polydimethylsiloxanes, and any combination thereof, although other known soft-block originators and combinations may be used. In a preferred embodiment, the monofunctional anhydride is an hexahydropthalic anhydride because it possesses a known superior water stability, but any monofunctional anhydrides may be used as is suitable.

According to another embodiment of the invention, the epoxidized pre-reacted hydrophobic macromolecule is derived from a triglyceride fatty acid or a tall oil. Certain non-limiting preferred tall oils include vegetable-based oils such as soybean or linseed oil, along with any of the drying oils such as linseed, tung, poppy seed, walnut, and rapeseed oil, to name a few.

In an embodiment the epoxidized pre-reacted hydrophobic macromolecule is derived from a compound of the following formula:

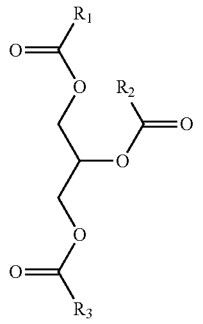

wherein $R_1$, $R_2$, and $R_3$ are the same or different, and are each a $C_4$-$C_{50}$ unsaturated alkyl chain, wherein the unsaturation has been at least 2% epoxidized, more preferably 10% epoxidized, more preferably 30% epoxidized. In another embodiment, the epoxidized pre-reacted hydrophobic macromolecule is derived from the an epoxidized soybean oil (ESO), such as the following:

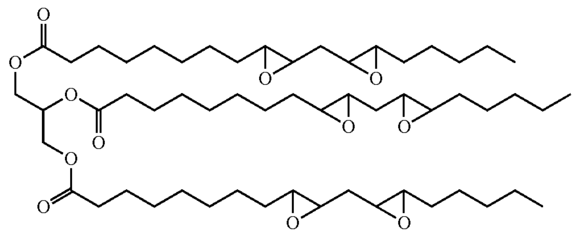 [SMILES: CCCCCC1OC1CC1OC1CCCCCCCC(=O)OCC(COC(=O)CCCCCCCC1OC1CC1OC1CCCCC)OC(=O)CCCCCCCC1OC1CC1OC1CCCCC]

In an embodiment, the epoxidized triglyceride or tall oil is reacted with an alkyl chain carboxylic acid to form a pre-reacted hydrophobic macromolecule.

As would be well-known by one of ordinary skill in the art to which this invention applies, the synthesis of epoxidized pre-reacted hydrophobic macromolecules according to the present invention are carried out in the presence of various catalysts. Any suitable catalysts known in the art could be used, especially weak base or chromium-base catalysts. In an embodiment, the catalyst used to enable to formation of the pre-reacted hydrophobic macromolecule is triphenylphosphine, available from Sigma Aldrich, or a chromium catalyst, such as the commercial product AMC-2 from AMPAC Fine Chemicals.

According to an embodiment, the ratio of equivalents utilized in the synthesis of the epoxidized pre-reacted hydrophobic macromolecule is 1 part epoxidized triglyceride or tall oils to 2 part alkyl chain carboxylic acids. In another embodiment, that ratio is 1:3. In other embodiments, the epoxidized pre-reacted hydrophobic macromolecule is synthesized by reacting, in terms of equivalents, a ratio of ESO to an alkyl chain carboxylic acid from about 2:3 to about 2:7, more preferably from about 1:2 to about 1:3.

In embodiments, the ratios and reagents are maintained within limits to ensure an appropriate length of the alkyl chain attached to the triglyceride or tall oil. This is because it is believed that the alkyl chain's length turn directly affects the macromolecule's hydrophobicity. Thus if the alkyl chain becomes too long, the macromolecule becomes too hydrophobic and will not readily react with the surrounding rubber toughenable base resin matrix. If it becomes too short, on the other hand, it may not possess the requisite hydrophobicity to phase-separate from the matrix.

The epoxidized pre-reacted hydrophobic macromolecules of the present invention can optionally be further acrylate functionalized prior to incorporation in the rubber toughenable base resin. This can occur, by for example, acrylate-functionalizing the alkyl chain carboxylic acid prior to the reaction with the epoxidized triglyceride or tall oil in the presence of a suitable catalyst to yield an acrylate-functionalized epoxidized pre-reacted hydrophobic macromolecule. Especially, when this has occurred, the accompanying rubber toughenable base resin need not necessarily contain cationically curable components. Therefore, in an embodiment of the invention wherein the liquid phase-separating toughening agent is an acrylate functionalized pre-reacted hydrophobic macromolecule, components (1) and (3), namely, the cationically polymerizable component and cationic photoinitiator, respectively, are not present in the composition. Regardless, the descriptions of examples and combinations of cationically polymerizable components, free-radically polymerizable components, cationic photoinitiators, free-radical photoinitiators, and additives as described in the description accompanying the first aspect of the present invention are also equally available for creating rubber toughenable resins suitable for use according to the second aspect of the present invention as well.

Solubility of Liquid Phase-Separating Toughening Agents, and its Relation to Compatibility with Rubber Toughenable Base Resin Matrices Inventors have surprisingly further discovered that a liquid phase-separating toughening agent's solubility within its associated rubber toughenable base resin is of significant importance when ensuring optimum usefulness therewith. Specifically, according to certain embodiments of the invention, if the solubility delta of the liquid phase-separating toughening agent and its associated rubber toughenable base resin is within certain ranges, the toughness of the resulting cured three-dimensional articles are improved, and the heat resistance is sufficiently maintained. In embodiments of the invention, this factor, along with the aforementioned $M_C$ values of the corresponding rubber toughenable base resin, enable the skilled artisan to select optimally compatible compositional substituents that impart superior toughness and heat resistance properties into the three-dimensional objects cured therefrom.

As used herein, solubility "deltas" can be expressed by using the Hansen solubility parameters (HSP). The deltas expressed herein would represent the theoretical straight-line distance in the three dimensional Hansen space between the rubber toughenable base resin and the liquid phase-separating toughening agent. According to a preferred embodiment, the deltas are from about 10 to about 25, in another embodiment from 10-15, in another embodiment from 15-20, in another embodiment from 20-25.

A third aspect of the claimed invention is a process of forming a three-dimensional object comprising the steps of forming and selectively curing a liquid layer of the radiation curable composition for additive fabrication with improved toughness according to either the first or second aspects of the claimed invention with actinic radiation and repeating the steps of forming and selectively curing the liquid layer of the radiation curable composition for additive fabrication according to the first or second aspects of the claimed invention a plurality of times to obtain a three-dimensional object.

A fourth aspect of the claimed invention is the three-dimensional object formed by the process according to the third aspect of the claimed invention from the radiation curable composition for additive fabrication with improved toughness according to either the first or second aspects of the claimed invention.

The following examples further illustrate the invention but, of course, should not be construed as in any way limiting its scope.

EXAMPLES

These examples illustrate embodiments of radiation curable compositions for additive fabrication with improved toughness according to the instant invention. Table 1 describes the various commercially available raw materials which constitute various components or sub-components, as the case may be, of the radiation curable compositions for additive fabrication with improved toughness used in the present examples. Table 2, meanwhile, describes the synthesis of the liquid hydrophobic macromolecular phase-separating toughening agents which are not commercially available and are used in the present examples.

TABLE 1

| Component | Function in Formula | Chemical Descriptor | Supplier/ Manufacturer |
|---|---|---|---|
| PerFORM | Base resin | Radiation curable composition with cationically & free-radically polymerizable components, cationic & free-radical photoinitiator | DSM Somos ® |
| Prototherm | Base resin | Radiation curable composition with cationically & free-radically polymerizable components, cationic & free-radical photoinitiator; manufacturer-provided $M_C$ of 141.3 | DSM Somos ® |
| Protogen 18120 (Protogen) | Base resin | Radiation curable composition with cationically & free-radically polymerizable components, cationic & free-radical photoinitiator; manufacturer-provided $M_C$ of 163.2 | DSM Somos ® |
| Somos NeXt | Base resin | Radiation curable composition with cationically & free-radically polymerizable components, cationic & free-radical photoinitiator; core-shell particles; manufacturer-provided $M_C$ of 173.4 | DSM Somos ® |
| Modified NeXt | Base resin | Radiation curable composition with cationically & free-radically polymerizable components, cationic & free-radical photoinitiator; filtered to remove core-shell particles | DSM Somos ® |
| Clear | Base resin | Radiation curable composition for additive fabrication containing free-radically polymerizable component and free-radical photoinitiator | FormLabs |
| Acclaim 8200 | Liquid phase separating toughing agent (LPSTA) | Polyether polyol, 8,000 MW diol | Covestro |
| Acclaim 4200 | LPSTA | Polyether polyol, 4,200 MW diol | Covestro |
| Beta Tough 2cr | LPSTA | 44% solution of naturally derived epoxidized rubber in butanediol diglycidyl ether | Croda |
| Polybutadiene oligomer (PBD) | Liquid phase separating toughening sub-agent (LPSTsub) | polybutadiene polyol; 1,300 g/mol and Mu 2,800 g/mol | Cray Valley |
| Pluronic F127 | LPSTsub | Polyethylene oxide-polypropylene oxide-polyethylene oxide triblock copolymer; Mn ~13,000 g/mol | BASF |
| Hexahydrophthalic anhydride (HHPA) | LPSTsub | Hexahydrophthalic anhydride | Sigma-Aldrich |
| Celloxide 2021P | Cationically polymerizable component | 3,4-epoxycyclohexylmethyl-3',4'-epoxycyclohexanecarboxylate | Daicel Corporation |

TABLE 1-continued

| Component | Function in Formula | Chemical Descriptor | Supplier/ Manufacturer |
|---|---|---|---|
| Epon 828 | Cationically polymerizable component | Bisphenol A diglycidyl ether | Momentive |
| —OH Functional PDMS (PDMS) | LPSTsub | Polydimethylsiloxane Polyol; $M_n$ ~1,000 g/mol | GELEST |
| Jenkinol ® 680 (ESO) | LPSTsub | Epoxidized soybean oil | Acme-Hardesty |
| Triphenyl-phosphine | Catalyst | "Tpp" | Sigma-Aldrich |
| AFC ACCELERATOR AMC-2 | Catalyst | Chromium-based catalyst | AMPAC Fine Chemicals (AFC) |
| Jaric I-16 (I-16) | LPSTsub | Branched alkyl chain acid; isopalmitic (2-hexyldecanoic acid) | Jarchem |
| Jaric I-24 (I-24) | LPSTsub | Branched alkyl chain acid; isopalmitic (2-hexyldecanoic acid) | Jarchem |
| Acrylate functionalized carboxylic acid | LPSTsub | Acrylate functionalized carboxylic acid | Synthesized in-house from 2-HEA + HHPA w/ DABCO catalyst |

Synthesis of Liquid Hydrophobic Macromolecular Phase-Separating Toughening Agents Triblock copolymer "ABA" type hydrophobic macromolecular phase separating toughening agents were generally synthesized from hydrophobic center "B" blocks end-capped with polar and reactive "A" blocks. To connect B with A, an anhydride small molecule was used as linker. A typical synthetic procedure was as follows. To a 3-neck round bottom flask equipped with thermometer and mechanical stirrer was added 1 equivalent (X moles) of the hydrophobic center "B" oligomer block with —OH end group functionality. With gentle stirring, 2 equivalents (2× moles) of a monoanhydride, i.e. HHPA, was added along with 0.1 wt % of base catalyst (DABCO). This mixture was heated typically to 80° C. for several hours (typically 2 hours, but as long as 4 hours to ensure complete coupling of hydroxyl groups with anhydrides, forming carboxylic acid end group functional oligomers). Next, to this same vessel was added an excess of diepoxide end "A" block. Typical excess used was 5 equivalents (moles) of diepoxide monomer per 1 equivalent (mole) of hydrophobic center block oligomer. Since the molecular weight of the center block was in most cases much greater than the molecular weight of the diepoxide end blocks, the actual mass excess of free diepoxide after complete reaction was minimal. The acid+epoxy coupling catalyst was also added at 0.1 wt %; typical catalyst used was triphenylphosphine (TPP) but other catalysts such as the AMC-2 or other chromium catalysts are effective for this coupling reaction as well. The mixture was then heated to 105° C. for 5 to 6 hours with gentle stirring. At this time, a small aliquot of sample was taken from the reaction and analyzed for acid value (A.V.) using a Metrohm 751 GPD Titrino potentiometric titration system. If A.V. was sufficiently low corresponding to >95% consumption of carboxylic acid groups, the product was poured off and stored. If not, reaction was continued and sampled periodically for A.V. until reaction completion was obtained. A slightly different synthesis was applied to the epoxy-functional ESO-based toughening additives where the ESO comes equipped with epoxide groups and so a direct reaction with carboxylic acids to hydrophobicize the ESO) was performed (i.e. no use of HHPA as linker). Various epoxidized pre-reacted hydrophobic macromolecules synthesized accordingly and used in the examples are presented in Table 2 below.

TABLE 2

| Name | Pre-reactants (Ratio by Equivalents) | Catalyst | Functionalized |
|---|---|---|---|
| PBD-based Toughener A | PBD ($M_n$ 2,800 g/mol) + HHPA (1:2) | DABCO | Celloxide 2021P |
| PBD-based Toughener B | PBD ($M_n$ 2,800 g/mol) + HHPA (1:2) | DABCO | Epon 828 |
| PBD-based Toughener C | PBD ($M_n$ 1,300 g/mol) + HHPA (1:2) | DABCO | Celloxide 2021P |
| PBD-based Toughener D | PBD ($M_n$ 1,300 g/mol) + HHPA (1:2) | DABCO | Epon 828 |
| Pluronic-based Toughener A | Pluronic + HHPA (1:2) | DABCO | Celloxide 2021P |
| Pluronic-based Toughener B | Pluronic + HHPA (1:2) | DABCO | Epon 828 |
| PDMS-based Toughener A | PDMS + HHPA (1:2) | DABCO | Celloxide 2021P |
| PDMS-based Toughener B | PDMS + HHPA (1:2) | DABCO | Epon 828 |
| ESO-based Toughener A | ESO + I-16 (1:2) | Triphenyl-phosphine | n/a |
| ESO-based Toughener B | ESO + I-16 (1:3) | Triphenyl-phosphine | n/a |
| ESO-based Toughener C | ESO + I-16 (1:3) | Triphenyl-phosphine | Acrylate w/carboxylic acid |
| ESO-based Toughener D | ESO + I-16 (1:3) | Chromium | n/a |
| ESO-based Toughener E | ESO + I-24 (1:3) | Triphenyl-phosphine | n/a |

Examples 1-47

Various radiation curable compositions for additive fabrication were prepared according to well-known methods in the art, employing available base resin, along with one or more liquid phase-separating toughening agents. The specific compositions are reported in Table 3 below. These samples were then tested according to the methods described below for evaluation of one or more of Young's Modulus, Elongation at Break, HDT, Izod Notched Impact, and viscosity. The results are presented in Table 3.

Examples 1-5 and 42-47 represent three-dimensional components which were created in accordance with ASTM D638-10. Examples 6-41 were used by evaluating draw-down strips, which were created by the procedure described below.

All parts were washed with DOWANOL™ DPnB Glycol Ether, followed by IPA, to remove excess resin. Parts were then dried thoroughly with compressed air and UV post cured in a standard PCA chamber. The PCA chamber consisted of a rotating turntable surrounded by an alternating mix of Philips TLK 40W/05 and TLK 40W/03 lamps. Parts were post cured for 30 minutes per side, i.e. one hour total. In most cases, to obtain high HDT, parts were then thermally post cured (TPC) in an oven at 100° C. for two hours. Prior to testing, parts were then conditioned in a controlled temperature humidity (TH) room (23° C., 50% RH) for at least 48 hours.

Draw-Down Strip Creation

A sheet of flexible Mylar PET (4 mil thick) was taped to the top of a glass plate. Approximately 20 grams±2 grams of resin were poured onto the glass plate at one end spreading across the width of the Mylar sheet. This resin sample was then drawn down to a controlled thickness using a byko-drive Auto Applicator (BYK) and a 10 mil drawdown bar. These thin resin layers were then placed on top of a standard build platform loaded in a 3D Systems Viper SLA machine. A 3D part file consisting of 4 ASTM D256 tensile bar models was then loaded and one layer was imaged onto the thin draw down resin layer. Ec was typically set to 15; Dp typically set to 5. After this layer finished, the build was stopped. The entire glass plate, Mylar film, and resin layer (now with imaged tensile bar strips fixed to the Mylar) were removed from the SLA machine. Excess resin was gently wiped clean leaving the imaged tensile bars strips. The entire glass plate, Mylar film, and imaged tensile bar strips remaining were then UV post cured for 30 minutes. Following UVPC, the tensile bar strips were gently removed by bending the Mylar film and peeling the strips away. The strips were then turned over and UV post cured for another 30 minutes. Typically, strips were then thermally post cured using procedures used for thermally post curing 3D parts in this work (i.e. 2 hours, 100° C.).

Measurement of Young's Modulus & Elongation at Break

Samples were tested in accordance with ASTM D638-10, except as modified as described herein. Samples were built by a Viper SLA machine (S/N 03FB0244 or S/N 02FB0160), manufactured by 3D Systems, Inc., to the standard, art-recognized Type I "dogbone" shape with an overall length of 6.5 inches, an overall width of ¾ of an inch (0.75 inches), and an overall thickness of ⅛ of an inch (0.125 inches). Samples were conditioned for 7 days at 23° Celsius at 50% relative humidity. The conditioning period exceeds the minimum prescribed in the ASTM 618-13 standard to ensure maximum stabilization in the cationic cure of the hybrid system. The samples were measured and then placed in the Sintech tensile-tested S/N using the 6500 N load cell S/N # with a 50% extensometer SN #. The speed of testing was set at 5.1 mm/min with a nominal strain rate of 0.1 mm/min at the start of test. The Young's modulus or Modulus of Elasticity was calculated by extending the initial linear portion of the load-extension curve and dividing the difference in stress corresponding to any segment of the section on this straight line by the corresponding difference in strain. All elastic modulus values were computed using the average original cross sectional area in the gage length segment of the specimen in the calculations. The Percent Elongation at break was calculated by reading the extension at point of specimen rapture and dividing that extension by the original gage length and multiplying by 100. Standard deviations were calculated according to known statistical methods.

Measurement of Heat Deflection Temperature

Heat Deflection Temperature (HDT) is tested on parts built, washed, and UV postcured, as previously described. Specimens are numbered and allowed to condition at 23° C., 50% relative humidity for a period of not less than 48 hours. Part dimensions and test method is as described in ASTM D648-00a Method B. Reported HDT values are for an applied stress of 0.45 MPa (66 psi). Care was taken to ensure that the test contacts for the HDT tester were in contact with smooth surfaces of the polymer part. It has been found that surface irregularities (i.e. non-smooth surfaces) can contribute to a lower HDT than measuring a smooth part surface. Top surfaces of HDT parts are typically smooth without alteration. Sidewalls and bottom-facing surfaces were sanded with 100 grit followed by 250 grit sandpaper to ensure a smooth testing surface before measurement. Listed HDT data are for parts that have not experienced thermal postcure.

Viscosity

The viscosity of each sample was taken with an Anton Paar Rheoplus Rheometer (S/N 80325376) using a Z3/Q1 measuring cylinder (S/N 10571) with a 25 mm diameter. The temperature was set at 30° Celsius with a shear rate of 50 $s^{-1}$. The rotational speed was set at 38.5 $min^{-1}$. The measuring container was a H-Z3/SM cup (diameter 27.110 mm) which was filled with 21.4 grams of sample (enough to the spindle). Measurements were recorded in millipascal-seconds (mPa·s), but converted and reported herein as centipoise (cPs).

Notched Izod Impact Strength

Izod impact tests of specimen were tested according to ASTM D256A. Parts were built by a Viper SLA machine (S/N 03FB0244 or S/N 02FB0160) manufactured by 3D Systems, Inc. to the standing testing size according to ASTM D256A. Specimen were conditioned for at least 48 hours at 23° Celsius at 50% relative humidity after a thermal post-cure. The specimen were then notched with a Qualitest saw. They were then tested on a Zwick/Roell HIT5.5P instrument, using an Izod Hammer of 2.75 J. The average of at least 5 test specimens is reported.

TABLE 3

| Component | Ex 1 | Ex 2 | Ex 3 | Ex 4 | Ex 5 | Ex 6 | Ex 7 | Ex 8 | Ex 9 | Ex10 |
|---|---|---|---|---|---|---|---|---|---|---|
| Somos LV Grey | 100 | 0 | 0 | 0 | 0 | 0 | 0 | 0 | 0 | 0 |
| Somos Prototherm | 0 | 0 | 0 | 0 | 0 | 100 | 100 | 100 | 100 | 100 |
| Somos Protogen | 0 | 100 | 100 | 0 | 0 | 0 | 0 | 0 | 0 | 0 |
| Somos Modified NeXt | 0 | 0 | 0 | 100 | 100 | 0 | 0 | 0 | 0 | 0 |
| Formlabs Clear | 0 | 0 | 0 | 0 | 0 | 0 | 0 | 0 | 0 | 0 |
| Acclaim 8200 | 0 | 0 | 5 | 0 | 5 | 0 | 0 | 0 | 0 | 0 |

TABLE 3-continued

| | | | | | | | | | | |
|---|---|---|---|---|---|---|---|---|---|---|
| Acclaim 4000 | 0 | 0 | 0 | 0 | 0 | 0 | 0 | 0 | 0 | 0 |
| Beta Tough 2cr | 14 | 0 | 0 | 0 | 0 | 0 | 0 | 0 | 0 | 0 |
| PBD-based Toughener A | 0 | 0 | 0 | 0 | 0 | 0 | 2 | 0 | 5 | 0 |
| PBD-based Toughener B | 0 | 0 | 0 | 0 | 0 | 0 | 0 | 2 | 0 | 5 |
| PBD-based Toughener C | 0 | 0 | 0 | 0 | 0 | 0 | 0 | 0 | 0 | 0 |
| PBD-based Toughener D | 0 | 0 | 0 | 0 | 0 | 0 | 0 | 0 | 0 | 0 |
| Pluronic-based Toughener A | 0 | 0 | 0 | 0 | 0 | 0 | 0 | 0 | 0 | 0 |
| Pluronic-based Toughener B | 0 | 0 | 0 | 0 | 0 | 0 | 0 | 0 | 0 | 0 |
| PDMS-based Toughener A | 0 | 0 | 0 | 0 | 0 | 0 | 0 | 0 | 0 | 0 |
| PDMS-based Toughener B | 0 | 0 | 0 | 0 | 0 | 0 | 0 | 0 | 0 | 0 |
| ESO-based Toughener A | 0 | 0 | 0 | 0 | 0 | 0 | 0 | 0 | 0 | 0 |
| ESO-based Toughener B | 0 | 0 | 0 | 0 | 0 | 0 | 0 | 0 | 0 | 0 |
| ESO-based Toughener C | 0 | 0 | 0 | 0 | 0 | 0 | 0 | 0 | 0 | 0 |
| ESO-based Toughener D | 0 | 0 | 0 | 0 | 0 | 0 | 0 | 0 | 0 | 0 |
| ESO-based Toughener E | 0 | 0 | 0 | 0 | 0 | 0 | 0 | 0 | 0 | 0 |
| Elongation at Break (%) | 21.3 | 6.5 | 12.4 | 9.4 | 23.0 | 2.3 | 2.6 | 2.9 | 2.2 | 2.5 |
| Young's Modulus (MPa) | 2410 | 2960 | 2410 | 3010 | 2250 | 3494 | 3276 | 3250 | 2960 | 3009 |
| HDT (° C.) | n/a | 97.6 | 100.8 | 55.5 | 52.7 | 127 | 125 | 122 | 127 | 114 |
| Izod Impact (J/cm) | 0.39 | 0.23 | 0.31 | 0.25 | 0.28 | n/a | n/a | n/a | n/a | n/a |
| Viscosity (cPs) | 657 | n/a | n/a | n/a | n/a | n/a | n/a | n/a | n/a | n/a |

| Component | Ex 11 | Ex 12 | Ex 13 | Ex 14 | Ex 15 | Ex 16 | Ex 17 | Ex 18 | Ex 19 | Ex20 |
|---|---|---|---|---|---|---|---|---|---|---|
| Somos LV Grey | 0 | 0 | 0 | 0 | 0 | 0 | 0 | 0 | 0 | 0 |
| Somos Prototherm | 100 | 100 | 100 | 100 | 100 | 100 | 100 | 100 | 100 | 100 |
| Somos Protogen | 0 | 0 | 0 | 0 | 0 | 0 | 0 | 0 | 0 | 0 |
| Somos Modified NeXt | 0 | 0 | 0 | 0 | 0 | 0 | 0 | 0 | 0 | 0 |
| Formlabs Clear | 0 | 0 | 0 | 0 | 0 | 0 | 0 | 0 | 0 | 0 |
| Acclaim 8200 | 0 | 0 | 0 | 0 | 0 | 0 | 0 | 0 | 0 | 0 |
| Acclaim 4000 | 0 | 0 | 0 | 0 | 0 | 0 | 0 | 0 | 0 | 0 |
| Beta Tough 2cr | 0 | 0 | 0 | 0 | 0 | 0 | 0 | 0 | 0 | 0 |
| PBD-based Toughener A | 10 | 0 | 0 | 0 | 0 | 0 | 0 | 0 | 0 | 0 |
| PBD-based Toughener B | 0 | 10 | 0 | 0 | 0 | 0 | 0 | 0 | 0 | 0 |
| PBD-based Toughener C | 0 | 0 | 2 | 0 | 5 | 0 | 10 | 0 | 0 | 0 |
| PBD-based Toughener D | 0 | 0 | 0 | 2 | 0 | 5 | 0 | 10 | 0 | 0 |
| Pluronic-based Toughener A | 0 | 0 | 0 | 0 | 0 | 0 | 0 | 0 | 2 | 0 |
| Pluronic-based Toughener B | 0 | 0 | 0 | 0 | 0 | 0 | 0 | 0 | 0 | 2 |
| PDMS-based Toughener A | 0 | 0 | 0 | 0 | 0 | 0 | 0 | 0 | 0 | 0 |
| PDMS-based Toughener B | 0 | 0 | 0 | 0 | 0 | 0 | 0 | 0 | 0 | 0 |
| ESO-based Toughener A | 0 | 0 | 0 | 0 | 0 | 0 | 0 | 0 | 0 | 0 |
| ESO-based Toughener B | 0 | 0 | 0 | 0 | 0 | 0 | 0 | 0 | 0 | 0 |
| ESO-based Toughener C | 0 | 0 | 0 | 0 | 0 | 0 | 0 | 0 | 0 | 0 |
| ESO-based Toughener D | 0 | 0 | 0 | 0 | 0 | 0 | 0 | 0 | 0 | 0 |
| ESO-based Toughener E | 0 | 0 | 0 | 0 | 0 | 0 | 0 | 0 | 0 | 0 |
| Elongation at Break (%) | 1.5 | 2.4 | 2.6 | 2.6 | 3.1 | 3.1 | 3.0 | 3.0 | 2.7 | 3.2 |
| Young's Modulus (MPa) | 2111 | 2868 | 3182 | 3255 | 2990 | 2858 | 3242 | 2880 | 3221 | 2826 |
| HDT (° C.) | 125 | 92 | 129 | 124 | 121 | 109 | 122 | 94 | 128 | 117 |
| Izod Impact (J/cm) | n/a | n/a | n/a | n/a | n/a | n/a | n/a | n/a | n/a | n/a |
| Viscosity (cPs) | n/a | n/a | n/a | n/a | n/a | n/a | n/a | n/a | n/a | n/a |

| Component | Ex 21 | Ex 22 | Ex 23 | Ex 24 | Ex 25 | Ex 26 | Ex 27 | Ex 28 | Ex 29 | Ex30 |
|---|---|---|---|---|---|---|---|---|---|---|
| Somos LV Grey | 0 | 0 | 0 | 0 | 0 | 0 | 0 | 0 | 0 | 0 |
| Somos Prototherm | 100 | 100 | 100 | 100 | 100 | 100 | 100 | 100 | 100 | 100 |
| Somos Protogen | 0 | 0 | 0 | 0 | 0 | 0 | 0 | 0 | 0 | 0 |
| Somos Modified NeXt | 0 | 0 | 0 | 0 | 0 | 0 | 0 | 0 | 0 | 0 |
| Formlabs Clear | 0 | 0 | 0 | 0 | 0 | 0 | 0 | 0 | 0 | 0 |
| Acclaim 8200 | 0 | 0 | 0 | 0 | 0 | 0 | 0 | 0 | 0 | 0 |
| Acclaim 4000 | 0 | 0 | 0 | 0 | 0 | 0 | 0 | 0 | 0 | 0 |
| Beta Tough 2cr | 0 | 0 | 0 | 0 | 0 | 0 | 0 | 0 | 0 | 0 |
| PBD-based Toughener A | 0 | 0 | 0 | 0 | 0 | 0 | 0 | 0 | 0 | 0 |
| PBD-based Toughener B | 0 | 0 | 0 | 0 | 0 | 0 | 0 | 0 | 0 | 0 |
| PBD-based Toughener C | 0 | 0 | 0 | 0 | 0 | 0 | 0 | 0 | 0 | 0 |
| PBD-based Toughener D | 0 | 0 | 0 | 0 | 0 | 0 | 0 | 0 | 0 | 0 |
| Pluronic-based Toughener A | 5 | 0 | 10 | 0 | 0 | 0 | 0 | 0 | 0 | 0 |
| Pluronic-based Toughener B | 0 | 5 | 0 | 10 | 0 | 0 | 0 | 0 | 0 | 0 |
| PDMS-based Toughener A | 0 | 0 | 0 | 0 | 2 | 0 | 5 | 0 | 10 | 0 |
| PDMS-based Toughener B | 0 | 0 | 0 | 0 | 0 | 2 | 0 | 5 | 0 | 10 |
| ESO-based Toughener A | 0 | 0 | 0 | 0 | 0 | 0 | 0 | 0 | 0 | 0 |
| ESO-based Toughener B | 0 | 0 | 0 | 0 | 0 | 0 | 0 | 0 | 0 | 0 |
| ESO-based Toughener C | 0 | 0 | 0 | 0 | 0 | 0 | 0 | 0 | 0 | 0 |
| ESO-based Toughener D | 0 | 0 | 0 | 0 | 0 | 0 | 0 | 0 | 0 | 0 |
| ESO-based Toughener E | 0 | 0 | 0 | 0 | 0 | 0 | 0 | 0 | 0 | 0 |
| Elongation at Break (%) | 2.2 | 1.9 | 2.3 | 1.3 | 2.7 | 3.2 | 2.2 | 1.9 | 2.3 | 1.3 |
| Young's Modulus (MPa) | 3286 | 2985 | 2990 | 2864 | 3221 | 2826 | 3286 | 2985 | 2990 | 2864 |
| HDT (° C.) | 128 | 114 | 124 | 110 | 128 | 117 | 128 | 114 | 124 | 110 |
| Izod Impact (J/cm) | n/a | n/a | n/a | n/a | n/a | n/a | n/a | n/a | n/a | n/a |
| Viscosity (cPs) | n/a | n/a | n/a | n/a | n/a | n/a | n/a | n/a | n/a | n/a |

TABLE 3-continued

| Component | Ex 31 | Ex 32 | Ex 33 | Ex 34 | Ex 35 | Ex 36 | Ex 37 | Ex 38 | Ex 39 | Ex40 |
|---|---|---|---|---|---|---|---|---|---|---|
| Somos LV Grey | 0 | 0 | 0 | 0 | 0 | 0 | 0 | 0 | 0 | 0 |
| Somos Prototherm | 100 | 100 | 100 | 100 | 100 | 100 | 0 | 0 | 0 | 0 |
| Somos Protogen | 0 | 0 | 0 | 0 | 0 | 0 | 0 | 0 | 0 | 0 |
| Somos NeXt | 0 | 0 | 0 | 0 | 0 | 0 | 100 | 0 | 0 | 0 |
| Somos Modified NeXt | 0 | 0 | 0 | 0 | 0 | 0 | 0 | 100 | 100 | 0 |
| Formlabs Clear | 0 | 0 | 0 | 0 | 0 | 0 | 0 | 0 | 0 | 100 |
| Acclaim 8200 | 0 | 0 | 0 | 0 | 0 | 0 | 0 | 0 | 0 | 0 |
| Acclaim 4000 | 0 | 0 | 0 | 0 | 0 | 0 | 0 | 0 | 0 | 0 |
| Beta Tough 2cr | 0 | 0 | 0 | 0 | 0 | 0 | 0 | 0 | 0 | 0 |
| PBD-based Toughener A | 0 | 0 | 0 | 0 | 0 | 0 | 0 | 0 | 0 | 0 |
| PBD-based Toughener B | 0 | 0 | 0 | 0 | 0 | 0 | 0 | 0 | 0 | 0 |
| PBD-based Toughener C | 0 | 0 | 0 | 0 | 0 | 0 | 0 | 0 | 0 | 0 |
| PBD-based Toughener D | 0 | 0 | 0 | 0 | 0 | 0 | 0 | 0 | 0 | 0 |
| Pluronic-based Toughener A | 0 | 0 | 0 | 0 | 0 | 0 | 0 | 0 | 0 | 0 |
| Pluronic-based Toughener B | 0 | 0 | 0 | 0 | 0 | 0 | 0 | 0 | 0 | 0 |
| PDMS-based Toughener A | 0 | 0 | 0 | 0 | 0 | 0 | 0 | 0 | 0 | 0 |
| PDMS-based Toughener B | 0 | 0 | 0 | 0 | 0 | 0 | 0 | 0 | 0 | 0 |
| ESO-based Toughener A | 2 | 0 | 5 | 0 | 10 | 0 | 0 | 0 | 0 | 0 |
| ESO-based Toughener B | 0 | 2 | 0 | 5 | 0 | 10 | 0 | 5 | 2 | 0 |
| ESO-based Toughener C | 0 | 0 | 0 | 0 | 0 | 0 | 0 | 0 | 0 | 0 |
| ESO-based Toughener D | 0 | 0 | 0 | 0 | 0 | 0 | 0 | 0 | 0 | 0 |
| ESO-based Toughener E | 0 | 0 | 0 | 0 | 0 | 0 | 0 | 0 | 0 | 0 |
| Elongation at Break (%) | 2.6 | 3.6 | 3.1 | 3.7 | 3.2 | 3.5 | 2.8 | 3.0 | 2.9 | 7.2 |
| Young's Modulus (MPa) | 2971 | 2926 | 2600 | 2821 | 2358 | 2511 | 2936 | 2615 | 2570 | 2519 |
| HDT (° C.) | 128 | 122 | 126 | 121 | 117 | 115 | n/a | n/a | n/a | 76 |
| Izod Impact (J/cm) | n/a | n/a | n/a | n/a | n/a | n/a | n/a | n/a | n/a | 0.19 |
| Viscosity (cPs) | n/a | n/a | n/a | n/a | n/a | n/a | n/a | n/a | n/a | n/a |

| Component | Ex 41 | Ex 42 | Ex 43 | Ex 44 | Ex 45 | Ex 46 | Ex 47 | Ex 48 | Ex 49 | Ex50 |
|---|---|---|---|---|---|---|---|---|---|---|
| Somos LV Grey | 0 | 0 | 0 | 0 | 0 | 0 | 0 | | | |
| Somos Prototherm | 0 | 0 | 0 | 0 | 0 | 0 | 0 | | | |
| Somos Protogen | 0 | 100 | 100 | 100 | 100 | 100 | 100 | | | |
| Somos NeXt | 0 | 0 | 0 | 0 | 0 | 0 | 0 | | | |
| Somos Modified NeXt | 0 | 0 | 0 | 0 | 0 | 0 | 0 | | | |
| Formlabs Clear | 100 | 0 | 0 | 0 | 0 | 0 | 0 | | | |
| Acclaim 8200 | 0 | 0 | 0 | 0 | 0 | 0 | 0 | | | |
| Acclaim 4000 | 0 | 0 | 0 | 0 | 0 | 0 | 0 | | | |
| Beta Tough 2cr | 0 | 0 | 0 | 0 | 0 | 0 | 0 | | | |
| PBD-based Toughener A | 0 | 0 | 0 | 0 | 0 | 0 | 0 | | | |
| PBD-based Toughener B | 0 | 0 | 0 | 0 | 0 | 0 | 0 | | | |
| PBD-based Toughener C | 0 | 0 | 0 | 0 | 0 | 0 | 0 | | | |
| PBD-based Toughener D | 0 | 0 | 0 | 0 | 0 | 0 | 0 | | | |
| Pluronic-based Toughener A | 0 | 0 | 0 | 0 | 0 | 0 | 0 | | | |
| Pluronic-based Toughener B | 0 | 0 | 0 | 0 | 0 | 0 | 0 | | | |
| PDMS-based Toughener A | 0 | 0 | 0 | 0 | 0 | 0 | 0 | | | |
| PDMS-based Toughener B | 0 | 0 | 0 | 0 | 0 | 0 | 0 | | | |
| ESO-based Toughener A | 0 | 0 | 0 | 0 | 0 | 0 | 0 | | | |
| ESO-based Toughener B | 0 | 0 | 5 | 3 | 10 | 0 | 0 | | | |
| ESO-based Toughener C | 5 | 0 | 0 | 0 | 0 | 0 | 0 | | | |
| ESO-based Toughener D | 0 | 0 | 0 | 0 | 0 | 5 | 0 | | | |
| ESO-based Toughener E | 0 | 0 | 0 | 0 | 0 | 0 | 5 | | | |
| Elongation at Break (%) | 10.6 | 7.1 | 17.7 | 8.9 | 10.2 | 8.7 | 13.9 | | | |
| Young's Modulus (MPa) | 2338 | 2838 | 2435 | 2786 | 2029 | 2386 | 2206 | | | |
| HDT (° C.) | 71 | 95 | 94 | n/a | n/a | n/a | n/a | | | |
| Izod Impact (J/cm) | 0.26 | .28 | .31 | n/a | n/a | n/a | n/a | | | |
| Viscosity (cPs) | n/a | n/a | n/a | n/a | n/a | n/a | n/a | | | |

Additional Exemplary Embodiments

A first aspect of a first additional exemplary embodiment of the invention is a radiation curable composition for additive fabrication with improved toughness comprising:

- a rubber toughenable base resin further comprising
  - a cationically polymerizable component;
  - a radically polymerizable component;
  - a cationic photoinitiator;
  - a free radical photoinitiator; and
  - optionally, customary additives; and
  - a liquid phase-separating toughening agent;
- wherein the liquid phase-separating toughening agent is present in an amount, relative to the weight of the rubber toughenable base resin, in a ratio from about 1:99 to about 1:3, more preferably about 1:99 to about 1:4, more preferably about 1:99 to about 1:9, more preferably about 1:50 to about 1:12, more preferably about 1:19; and
- wherein the average molecular weight between crosslinks ($M_C$) of the rubber toughenable base resin is greater than 130 g/mol, more preferably greater than 150 g/mol; in another embodiment more preferably greater than 160 g/mol; and in another embodiment greater than 180 g/mol.

An additional aspect of the first additional exemplary embodiment is a radiation curable composition for additive fabrication with improved toughness according to any of the previous aspects of the first additional exemplary embodiment, wherein the liquid phase-separating toughening agent is a high molecular weight dimer fatty acid polyol.

An additional aspect of the first additional exemplary embodiment is a radiation curable composition for additive fabrication with improved toughness according to any of the previous aspects of the first additional exemplary embodiment, wherein the high molecular weight polyol is selected to be configured to form, after curing of the radiation curable composition, phase domains with an average size of from about 2 microns to about 25 microns, or from about 5 microns to about 20 microns, or from about 7 microns to about 15 microns, when measured according to an Average Phase Domain Size Procedure.

An additional aspect of the first additional exemplary embodiment is a radiation curable composition for additive fabrication with improved toughness according to any of the previous aspects of the first additional exemplary embodiment, wherein the high molecular weight dimer fatty acid polyol possesses a molecular weight of greater than 2000 g/mol, more preferably 3000 g/mol, more preferably greater than 8000 g/mol.

An additional aspect of the first additional exemplary embodiment is a radiation curable composition for additive fabrication with improved toughness according to any of the previous aspects of the first additional exemplary embodiment, wherein the high molecular weight dimer fatty acid polyol is a propylene oxide or ethylene oxide.

An additional aspect of the first additional exemplary embodiment is a radiation curable composition for additive fabrication with improved toughness according to any of the previous aspects of the first additional exemplary embodiment, wherein $M_C$ of the rubber toughenable base resin is less than 500 g/mol, more preferably less than 400 g/mol, more preferably less than 300 g/mol, more preferably less than 280 g/mol, more preferably less than 260 g/mol, more preferably less than 230 g/mol, less than 200 g/mol.

An additional aspect of the first additional exemplary embodiment is a radiation curable composition for additive fabrication with improved toughness according to any of the previous aspects of the first additional exemplary embodiment, wherein a three-dimensional component created therefrom by means of an additive fabrication process yields an elongation value that is at least 20% greater, more preferably at least 50% greater, more preferably 100% greater than a corresponding elongation value of a three dimensional component created from the constituent rubber toughenable base resin of said radiation curable composition.

An additional aspect of the first additional exemplary embodiment is a radiation curable composition for additive fabrication with improved toughness according to any of the previous aspects of the first additional exemplary embodiment, wherein a three-dimensional component created therefrom by means of an additive fabrication process yields an HDT value that is within at least 5 degrees, more preferably within at least 3 degrees, more preferably within at least 1 degree Celsius of a corresponding elongation value of a three dimensional component created from the constituent rubber toughenable base resin of said radiation curable composition.

A first aspect of a second additional exemplary embodiment is a radiation curable composition for additive fabrication with improved toughness comprising:

a rubber toughenable base resin further comprising (1) optionally, a cationically polymerizable component;

(2) a radically polymerizable component;

(3) optionally, a cationic photoinitiator;

(4) a free radical photoinitiator; and (5) optionally, customary additives; and a liquid phase-separating toughening agent;

wherein the liquid phase-separating toughening agent is an epoxidized pre-reacted hydrophobic macromolecule.

An additional aspect of the second additional exemplary embodiment is a radiation curable composition for additive fabrication according to any of the previous aspects of the second additional exemplary embodiment, wherein the average molecular weight between crosslinks ($M_C$) of the rubber toughenable base resin is greater than 130 g/mol, more preferably greater than 150 g/mol; in another embodiment more preferably greater than 160 g/mol; and in another embodiment greater than 180 g/mol;

wherein the $M_C$ of the rubber toughenable base resin is less than 500 g/mol, more preferably less than 400 g/mol, more preferably less than 300 g/mol, more preferably less than 280 g/mol, more preferably less than 260 g/mol, more preferably less than 230 g/mol, less than 200 g/mol.

An additional aspect of the second additional exemplary embodiment is a radiation curable composition for additive fabrication according to any of the previous aspects of the second additional exemplary embodiment, wherein the rubber toughenable base resin further contains less than 50%, more preferably less than 40%, more preferably less than 30% by weight, relative to the entire weight of the rubber toughenable base resin, of an aromatic glycidyl epoxy.

An additional aspect of the second additional exemplary embodiment is a radiation curable composition for additive fabrication according to any of the previous aspects of the second additional exemplary embodiment, wherein the glycidyl epoxy is a bisphenol A diglycidyl ether.

An additional aspect of the second additional exemplary embodiment is a radiation curable composition for additive fabrication according to any of the previous aspects of the second additional exemplary embodiment, wherein the rubber toughenable base resin further comprises a polyol component.

An additional aspect of the second additional exemplary embodiment is a radiation curable composition for additive fabrication according to any of the previous aspects of the second additional exemplary embodiment, wherein the polyol component is present in an amount, relative to the entire weight of the rubber toughenable base resin, of at least about 3%, more preferably at least 5%, more preferably 10%.

An additional aspect of the second additional exemplary embodiment is a radiation curable composition for additive fabrication according to any of the previous aspects of the second additional exemplary embodiment, wherein the epoxidized pre-reacted hydrophobic macromolecule is a triblock copolymer possessing terminating epoxy- or acrylate-functional hard blocks; and at least one immiscible soft block.

An additional aspect of the second additional exemplary embodiment is a radiation curable composition for additive fabrication according to any of the previous aspects of the second additional exemplary embodiment, wherein the triblock copolymer is formed by the reaction product of a soft-block originator with a monofunctional anhydride such as hexahydrophthalic anhydride, and then further reacting an epoxy-functional reactant.

An additional aspect of the second additional exemplary embodiment is a radiation curable composition for additive fabrication according to any of the previous aspects of the second additional exemplary embodiment, wherein the soft-block originator is selected from the group consisting of polybutadienes, polyols, and polydimethylsiloxanes, and any combination thereof.

An additional aspect of the second additional exemplary embodiment is a radiation curable composition for additive fabrication according to any of the previous aspects of the second additional exemplary embodiment, wherein the polyols are selected from the group consisting of polyethylene oxide and polypropylene oxide.

An additional aspect of the second additional exemplary embodiment is a radiation curable composition for additive fabrication according to any of the previous aspects of the second additional exemplary embodiment, wherein the epoxy-functional reactant is selected from the group consisting of 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl)adipate, vinylcyclohexene oxide, 4-vinylepoxycyclohexane, vinylcyclohexene dioxide, bis(3,4-epoxy-6-methylcyclohexylmethyl)adipate, 3,4-epoxy-6-methylcyclohexyl-3',4'-epoxy-6'-methylcyclohexanecarboxylate, ε-caprolactone-modified 3,4-epoxycyclohexylmethyl-3',4'-epoxycyclohexane carboxylates, trimethylcaprolactone-modified 3,4-epoxycyclohexylmethyl-3',4'-epoxycyclohexane carboxylates, β-methyl-δ-valerolactone-modified 3,4-epoxycyclohexcylmethyl-3',4'-epoxycyclohexane carboxylates, methylenebis(3,4-epoxycyclohexane), bicyclohexyl-3,3'-epoxide, bis(3,4-epoxycyclohexyl) with a linkage of —O—, —S—, —SO—, —$SO_2$—, —$C(CH_3)_2$—, —$CBr_2$—, —$C(CBr_3)_2$—, —$C(CF_3)_2$—, —$C(CCl_3)_2$—, or —$CH(C_6H_5)$—, dicyclopentadiene diepoxide, di(3,4-epoxycyclohexylmethyl) ether of ethylene glycol, ethylenebis(3,4-epoxycyclohexanecarboxylate), and epoxyhexahydrodioctylphthalate.

An additional aspect of the second additional exemplary embodiment is a radiation curable composition for additive fabrication according to any of the previous aspects of the second additional exemplary embodiment, wherein the epoxidized pre-reacted hydrophobic macromolecule is derived from a triglyceride fatty acid.

An additional aspect of the second additional exemplary embodiment is a radiation curable composition for additive fabrication according to any of the previous aspects of the second additional exemplary embodiment, wherein the epoxidized pre-reacted hydrophobic macromolecule is derived from a tall oil.

An additional aspect of the second additional exemplary embodiment is a radiation curable composition for additive fabrication according to any of the previous aspects of the second additional exemplary embodiment, wherein the epoxidized tall oil is an epoxidized vegetable oil, such as soybean or linseed oil.

An additional aspect of the second additional exemplary embodiment is a radiation curable composition for additive fabrication according to any of the previous aspects of the second additional exemplary embodiment, wherein the epoxidized pre-reacted hydrophobic macromolecule is derived from a compound of the following formula:

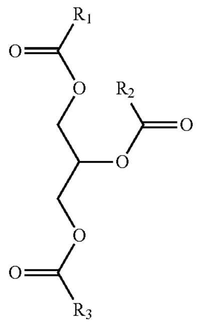

wherein $R_1$, $R_2$, and $R_3$ are the same or different, and are each a $C_4$-$C_{50}$ unsaturated alkyl chain, wherein the unsaturation has been at least 10% epoxidized, more preferably 30% epoxidized.

An additional aspect of the second additional exemplary embodiment is a radiation curable composition for additive fabrication according to any of the previous aspects of the second additional exemplary embodiment, wherein the epoxidized pre-reacted hydrophobic macromolecule is derived from the following compound:

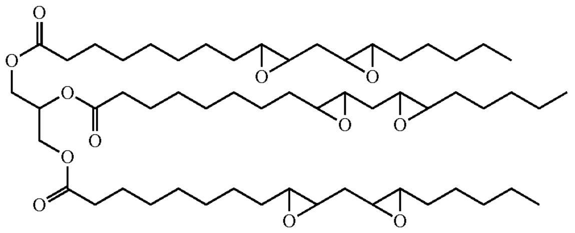 [SMILES: CCCCCC1OC1CC1OC1CCCCCCCC(=O)OCC(COC(=O)CCCCCCCC1OC1CC1OC1CCCCC)OC(=O)CCCCCCCC1OC1CC1OC1CCCCC]

An additional aspect of the second additional exemplary embodiment is a radiation curable composition for additive fabrication according to any of the previous aspects of the second additional exemplary embodiment, wherein the epoxidized pre-reacted hydrophobic macromolecule is the reaction product of an epoxidized soybean oil (ESO) and an alkyl chain carboxylic acid, thereby forming an ESO-based globular toughener.

An additional aspect of the second additional exemplary embodiment is a radiation curable composition for additive fabrication according to any of the previous aspects of the second additional exemplary embodiment, wherein the epoxidized pre-reacted hydrophobic macromolecule is synthesized in the presence of a catalyst.

An additional aspect of the second additional exemplary embodiment is a radiation curable composition for additive fabrication according to any of the previous aspects of the second additional exemplary embodiment, wherein the catalyst is selected from the group consisting of triphenylphosphine, chromium, or DABCO catalysts.

An additional aspect of the second additional exemplary embodiment is a radiation curable composition for additive fabrication according to any of the previous aspects of the second additional exemplary embodiment, wherein the alkyl chain carboxylic acid is liquid at room temperature.

An additional aspect of the second additional exemplary embodiment is a radiation curable composition for additive fabrication according to any of the previous aspects of the second additional exemplary embodiment, wherein the epoxidized pre-reacted hydrophobic macromolecule is synthesized by reacting, in terms of equivalents, a ratio of the ESO to the alkyl chain carboxylic acid from about 2:3 to about 2:7, more preferably from about 1:2 to about 1:3.

An additional aspect of the second additional exemplary embodiment is a radiation curable composition for additive fabrication according to any of the previous aspects of the second additional exemplary embodiment, wherein the alkyl chain carboxylic acid is selected from the group consisting of isopalmitic acid, 2-hexyl decanoic acid, and compounds of the following structure:

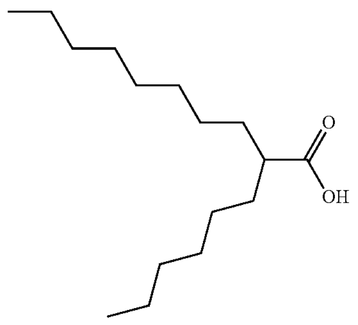 [SMILES: CCCCCCCCC(CCCCCC)C(=O)O]

An additional aspect of the second additional exemplary embodiment is a radiation curable composition for additive fabrication according to any of the previous aspects of the second additional exemplary embodiment, wherein the alkyl chain carboxylic acid possesses the following structure:

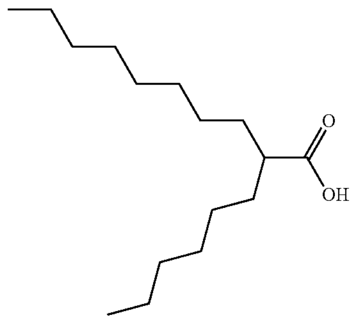 [SMILES: CCCCCCCCC(CCCCCC)C(=O)O]

An additional aspect of the second additional exemplary embodiment is a radiation curable composition for additive fabrication according to any of the previous aspects of the second additional exemplary embodiment, wherein the epoxidized pre-reacted hydrophobic macromolecule possesses the following structure:

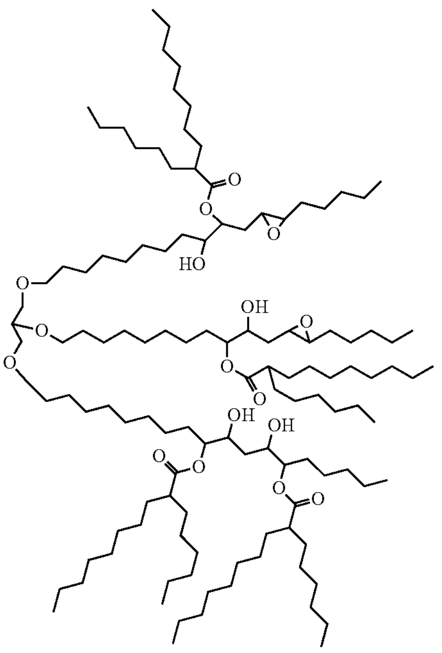 [SMILES: CCCCCCCCC(CCCCCC)C(=O)OC(CCCCC)C(O)CC(O)C(CCCCCCCCCOCC(COCCCCCCCCC(O)C(CC1OC1CCCCC)OC(=O)C(CCCCCC)CCCCCCCC)OCCCCCCCCC(OC(=O)C(CCCCCC)CCCCCCCC)C(O)CC1OC1CCCCC)OC(=O)C(CCCCCC)CCCCCCCC]

An additional aspect of the second additional exemplary embodiment is a radiation curable composition for additive fabrication according to any of the previous aspects of the second additional exemplary embodiment, wherein the epoxidized pre-reacted hydrophobic macromolecule possesses a molecular weight of from about 800 g/mol to about 4000 g/mol, more preferably from about 1000 g/mol to about 2500 g/mol, more preferably from about 1500 g/mol to about 2000 g/mol.

An additional aspect of the second additional exemplary embodiment is a radiation curable composition for additive fabrication according to any of the previous aspects of the second additional exemplary embodiment, wherein the epoxidized pre-reacted hydrophobic macromolecule is further acrylate functionalized.

An additional aspect of the second additional exemplary embodiment is a radiation curable composition for additive fabrication according to any of the previous aspects of the second additional exemplary embodiment, wherein the wherein epoxidized pre-reacted hydrophobic macromolecule that is further acrylate functionalized possesses the following structure:

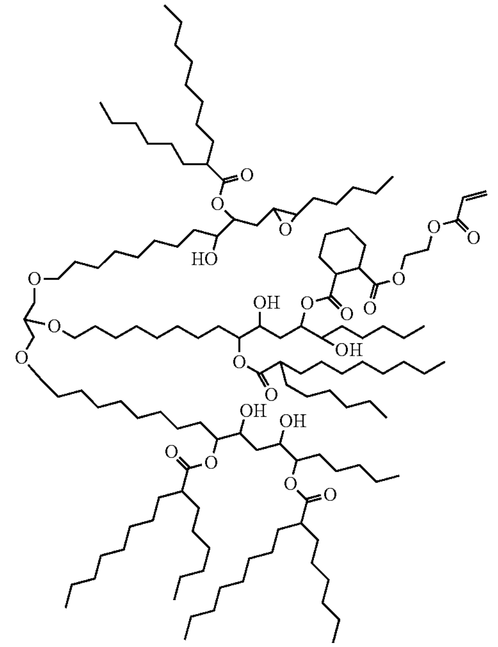 [SMILES: C=CC(=O)OCCOC(=O)C1CCCCC1C(=O)OC(CC(O)C(CCCCCCCCOC(COCCCCCCCCCC(OC(=O)C(CCCCCC)CCCCCCCC)C(O)CC(O)C(CCCCC)OC(=O)C(CCCCCC)CCCCCCCC)COCCCCCCCCC(O)C(CC1OC1CCCCC)OC(=O)C(CCCCCC)CCCCCCCC)OC(=O)C(CCCCCC)CCCCCCCC)C(O)CCCCC]

An additional aspect of the second additional exemplary embodiment is a radiation curable composition for additive fabrication according to any of the previous aspects of the second additional exemplary embodiment, wherein the epoxidized pre-reacted hydrophobic macromolecule is present, relative to the weight of the entire composition, in an amount from about 1% to about 20%, more preferably from about 1.5% to about 12%, more preferably from about 2% to about 10%, more preferably about 5%.

A first aspect of a third additional exemplary embodiment is a process of forming a three-dimensional object comprising the steps of forming and selectively curing a liquid layer of the radiation curable composition for additive fabrication with improved toughness of any of the aspects of either of the first or second additional exemplary embodiments of the invention with actinic radiation and repeating the steps of forming and selectively curing the liquid layer of the radiation curable composition for additive fabrication a plurality of times to obtain a three-dimensional object.

An additional aspect of the third additional exemplary embodiment is the three-dimensional object formed by the process of the first aspect of the third additional exemplary embodiment from the radiation curable composition for additive fabrication with improved toughness of any the aspects of either the first or second additional exemplary embodiments of the invention.

An additional aspect of the third additional exemplary embodiment is the three-dimensional object of the previous aspect of the third additional exemplary embodiment wherein the elongation value is at least 5%, more preferably at least 10%, more preferably at least 20%, more preferably at least 50%, and/or the HDT value is at least 75, more preferably at least 85, more preferably at least 95 degrees Celsius.

The use of the terms “a” and “an” and “the” and similar referents in the context of describing the invention (especially in the context of the following claims) are to be construed to cover both the singular and the plural, unless otherwise indicated herein or clearly contradicted by context. The terms “comprising,” “having,” “including,” and “containing” are to be construed as open-ended terms (i.e., meaning “including, but not limited to,”) unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., “such as”) provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While the invention has been described in detail and with reference to specific embodiments thereof, it will be apparent to one of ordinary skill in the art that various changes and modifications can be made therein without departing from the spirit and scope of the claimed invention.

What is claimed is:

1. A process of forming a three-dimensional object comprising the steps of forming a liquid layer of the radiation curable composition for additive fabrication; selectively curing said liquid layer of the radiation curable composition with actinic radiation; and repeating the steps of forming and selectively curing the liquid layer of the radiation curable composition for additive fabrication a plurality of times to obtain a three-dimensional object; wherein the radiation curable composition comprises:

a rubber toughenable base resin further comprising
- a cationically polymerizable component;
- a radically polymerizable component;
- a cationic photoinitiator;
- a free radical photoinitiator; and
- optionally, customary additives; and a liquid phase-separating toughening agent;

wherein the liquid phase-separating toughening agent is present in an amount, relative to the weight of the rubber toughenable base resin, in a ratio from 1:50 to about 1:3;

wherein the liquid phase-separating toughening agent comprises a polyether polyol of from about 2,000 g/mol to 10,000 g/mol;

wherein the average molecular weight between crosslinks (Mc) of the rubber toughenable base resin is between 150 and 500 g/mol; and wherein the radiation curable composition being polymerized exhibits an increase in an elongation-at-break (EAB) value of at least 5%, maintains a change of a heat deflection temperature (HDT) value within 7 degrees Celsius (° C.) when compared to the rubber toughenable base resin, and possesses an HDT value of at least 75 degrees Celsius (° C.).

2. The process of claim 1, wherein the three-dimensional object possesses an EAB value from 10% to 50%, and an HDT value of greater than 85° C.

3. The process of claim 2, wherein the polyether polyol is selected to be configured to form, after curing of the radiation curable composition, phase domains with an average size of from about 2 microns to about 25 microns, when measured according to an Average Phase Domain Size Procedure.

4. The process of claim 3, wherein the polyether polyol is a propylene or ethylene oxide which possesses a molecular weight of 8000 g/mol.

5. The process of claim 2, wherein the Mc of the rubber toughenable base resin is between 180 and 260 g/mol.

6. The process of claim 5, wherein the EAB value of the three-dimensional object is least 15%.

7. The process of claim 2, wherein the liquid phase-separating toughening agent comprises an epoxidized pre-reacted hydrophobic macromolecule.

8. The process of claim 7, wherein the rubber toughenable base resin further contains, relative to the entire weight of the rubber toughenable base resin, less than about 40 wt. % of at least one aromatic glycidyl epoxy, and at least about 5 wt. % of a polyol component.

9. The process of claim 7, wherein the epoxidized pre-reacted hydrophobic macromolecule is a triblock copolymer possessing terminating epoxy- or acrylate-functional hard blocks; and at least one immiscible soft block.

10. The process of claim 9, wherein the triblock copolymer is formed by the reaction product of a soft-block originator with a monofunctional anhydride such as hexahydrophthalic anhydride, and then further reacting an epoxy-functional reactant.

11. The process of claim 10, wherein the soft-block originator comprises polybutadienes, polyols, polydimethylsiloxanes, or combinations thereof.

12. The process of claim 7, wherein the epoxidized pre-reacted hydrophobic macromolecule is derived from a triglyceride fatty acid.

13. The process of claim 7, wherein the epoxidized pre-reacted hydrophobic macromolecule comprises the reaction product of a tall oil.

14. The process of claim 13, wherein the tall oil comprises soybean oil or linseed oil.

15. The process of claim 7, wherein the epoxidized pre-reacted hydrophobic macromolecule is derived from a compound of the following formula:

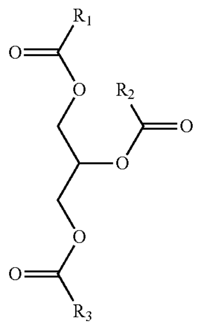

wherein $R_1$, $R_2$, and $R_3$ are the same or different, and are each a $C_4$-$C_{50}$ unsaturated alkyl chain, wherein the unsaturation has been at least 30% epoxidized.

16. The process of claim 7, wherein the epoxidized pre-reacted hydrophobic macromolecule possesses a molecular weight from 800 g/mol to about 4000 g/mol.

17. The process of claim 7, wherein the epoxidized pre-reacted hydrophobic macromolecule is present, relative to the weight of the entire composition, in an amount from about 1% to about 20%.

18. The process of claim 17, wherein the liquid phase-separating toughening agent is present in an amount, relative to the weight of the rubber toughenable base resin, in a ratio from 1:50 to 1:12.

19. The process of claim 17, wherein the epoxidized pre-reacted hydrophobic macromolecule is present, relative to the weight of the entire composition, in an amount from 1.5% to 12%, and the three-dimensional object possesses an HDT value of at least 95° C.

20. The process of claim 1, wherein the polyether polyol is a linear polypropylene diol.

21. The process of claim 1, wherein the radiation curable composition being polymerized maintains the change of the heat deflection temperature (HDT) value within 5 degrees Celsius (° C.) when compared to the rubber toughenable base resin.

* * * * *